United States Patent [19]

Saeki et al.

[11] Patent Number: 5,309,045
[45] Date of Patent: May 3, 1994

[54] CONFIGURABLE LOGIC ELEMENT WITH INDEPENDENTLY CLOCKED OUTPUTS AND NODE OBSERVATION CIRCUITRY

[75] Inventors: Yukihiro Saeki; Hiroki Muroga; Tomohisa Shigematsu; Toshio Hibi; Yasuo Kawahara; Kazunao Maru, all of Tokyo, Japan; Kenneth Austin, Northwich, England; Gordon S. Work; Darren M. Wedgwood, both of Warrington, England

[73] Assignees: Kabushiki Kaisha Toshiba, Kawasaki, Japan; Pilkington Micro-electronics, Ltd., Cheshire, England

[21] Appl. No.: 880,591

[22] Filed: May 8, 1992

[30] Foreign Application Priority Data

May 10, 1991 [JP] Japan .................. 3-105567

[51] Int. Cl.[5] .................. H03K 19/177; H03K 19/096
[52] U.S. Cl. .................... 307/465; 307/480; 307/243
[58] Field of Search ............ 307/243, 465, 465.1, 307/468, 480; 340/825.87

[56] References Cited

U.S. PATENT DOCUMENTS

| | | | |
|---|---|---|---|
| 4,684,830 | 8/1987 | Tsui et al. | 307/465 |
| 4,706,216 | 11/1987 | Carter | 365/94 |
| 4,758,985 | 7/1988 | Carter | 365/94 |
| 4,789,951 | 12/1988 | Birkner et al. | 307/465 |
| 4,910,417 | 3/1990 | El Gamal et al. | 307/465 |
| 4,912,345 | 3/1990 | Steele et al. | 307/465 |
| 4,931,671 | 6/1990 | Agrawal | 307/465 |
| 4,933,577 | 6/1990 | Wong et al. | 307/465 |
| 4,963,770 | 10/1990 | Keida | 307/243 |
| 5,001,368 | 3/1991 | Cliff et al. | 307/465 |
| 5,019,736 | 5/1991 | Furtek | 307/465 |
| 5,027,011 | 6/1991 | Steele | 30/465 |
| 5,144,166 | 9/1992 | Camarota et al. | 307/465 |

OTHER PUBLICATIONS

Mano, M. Morris; "Computer Engineering: Hardward Desgn"; ©1988 by Prentice-Hall, Inc.; p. 103.

Primary Examiner—Edward P. Westin
Assistant Examiner—Benjamin D. Driscoll
Attorney, Agent, or Firm—Banner, Birch, McKie & Beckett

[57] ABSTRACT

A programmable logic unit circuit comprising a data memory circuit, a combinational logic circuit supplied with at least two input signals, two input select circuits for, based on the stored data in the data memory circuit, selecting the two input signals supplied to the combinational logic circuit from more than two input signals, a clock-synchronized circuit for supplying the output signal from the combinational logic circuit in synchronization with a clock signal, and a 3-state-output type output select circuit for selecting either the output signal of the combinational logic circuit or the output signal of the clock-synchronized circuit, depending on the stored data in the data memory circuit.

19 Claims, 19 Drawing Sheets

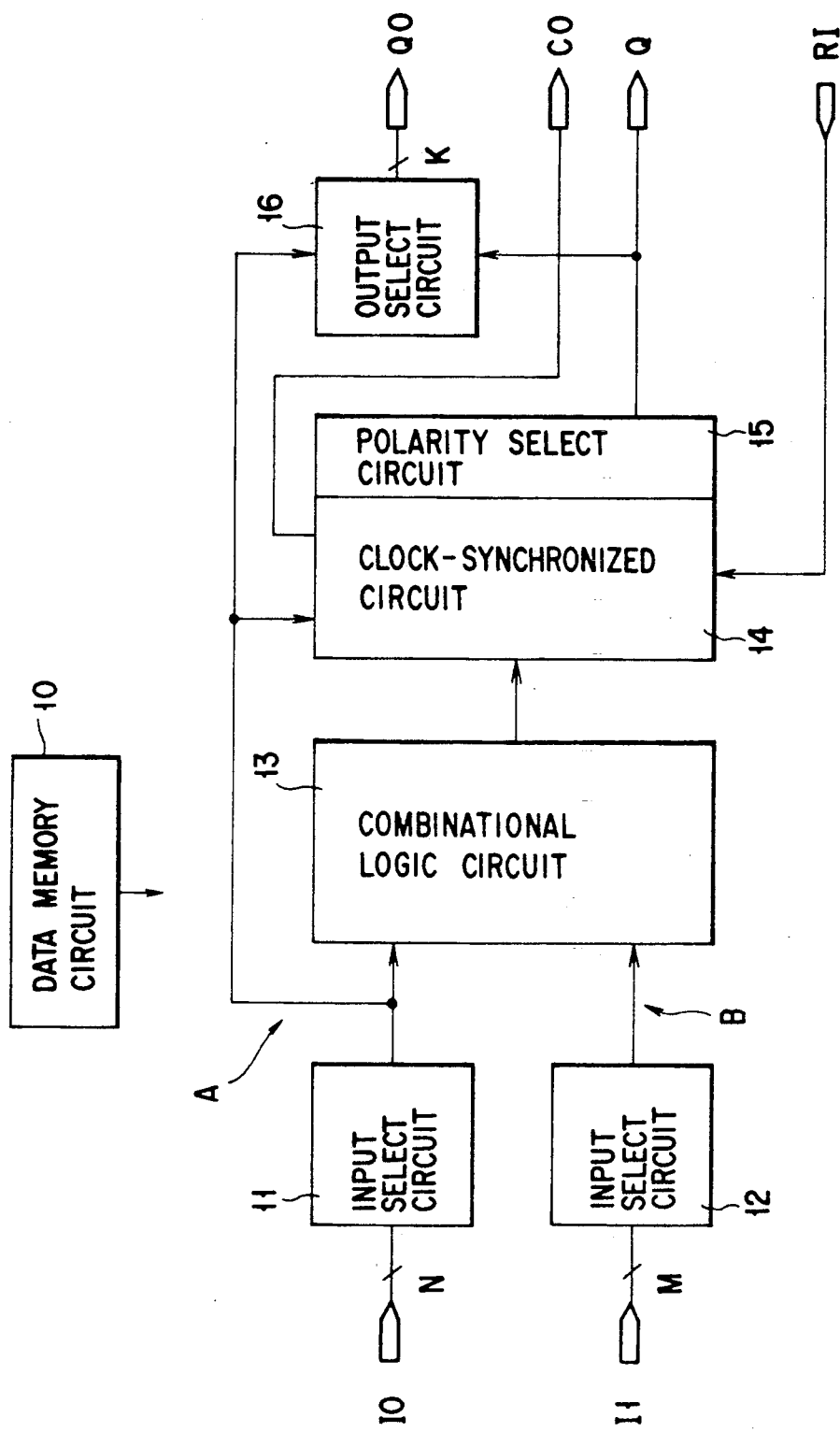
F I G. 1

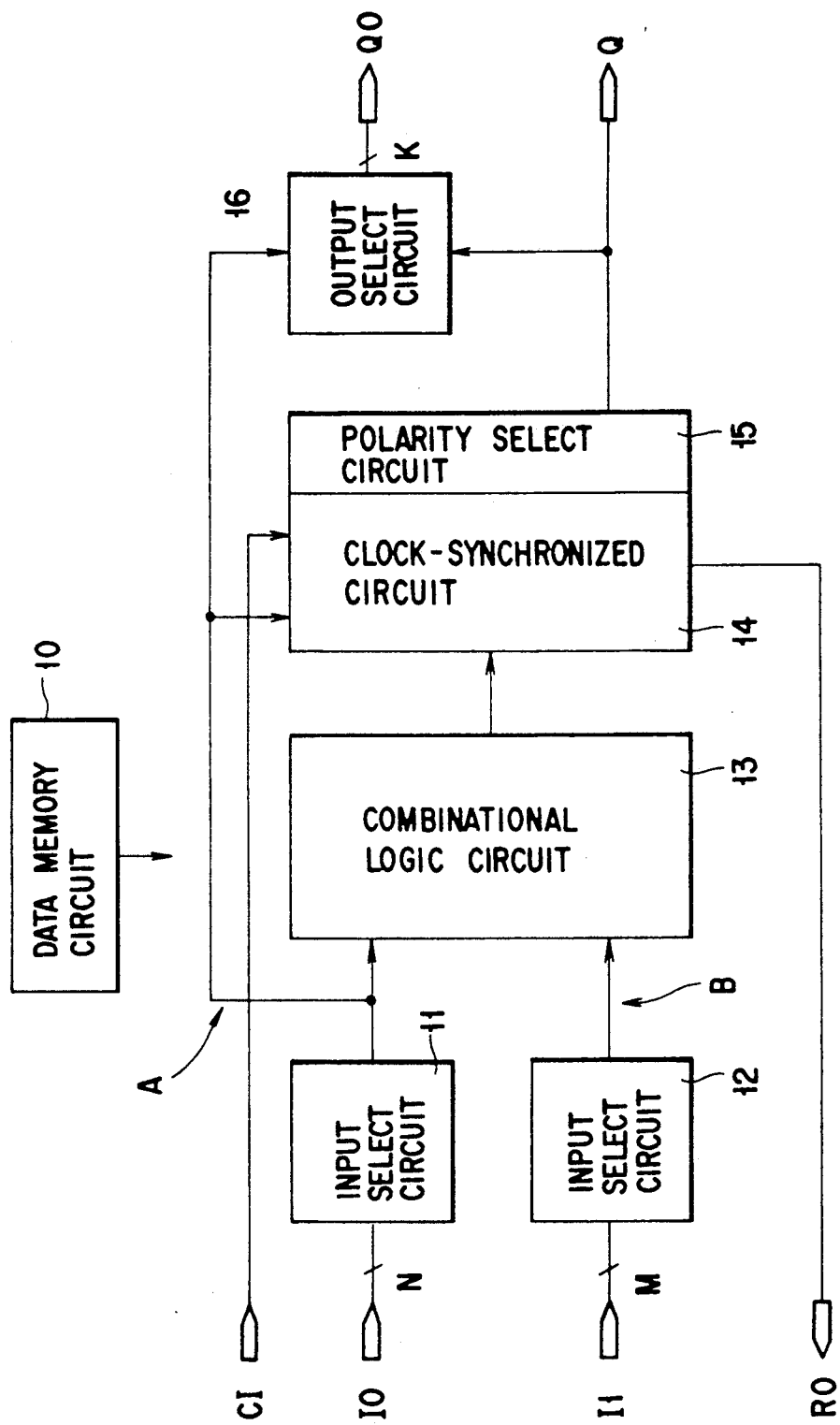
F I G. 2

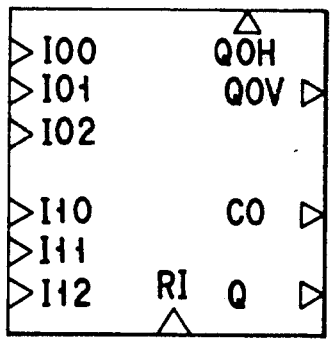
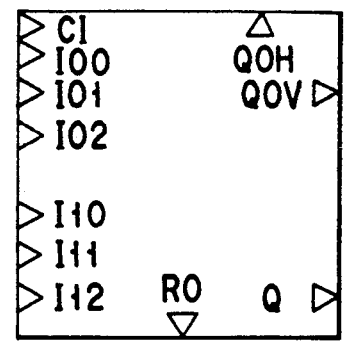
F I G. 7A    F I G. 7B
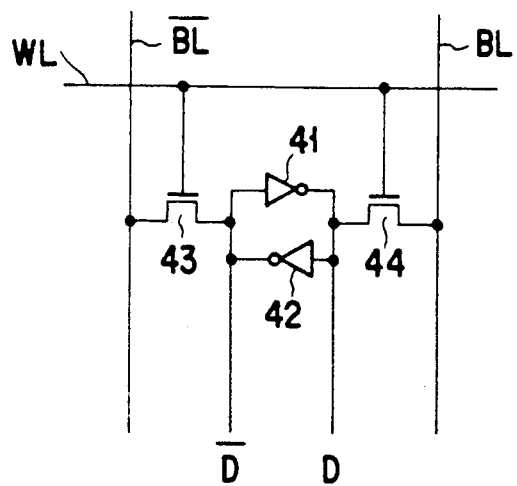
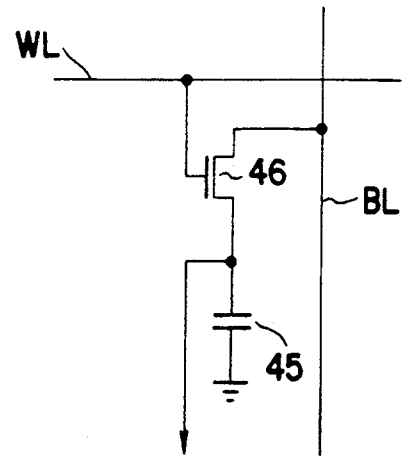
F I G. 8    F I G. 9

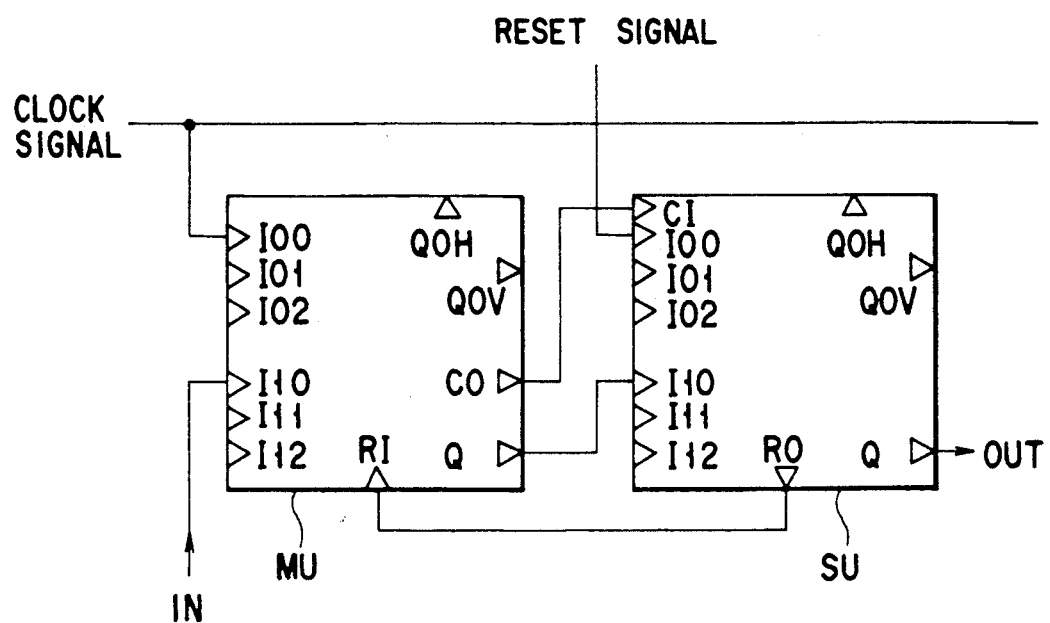
F I G. 12

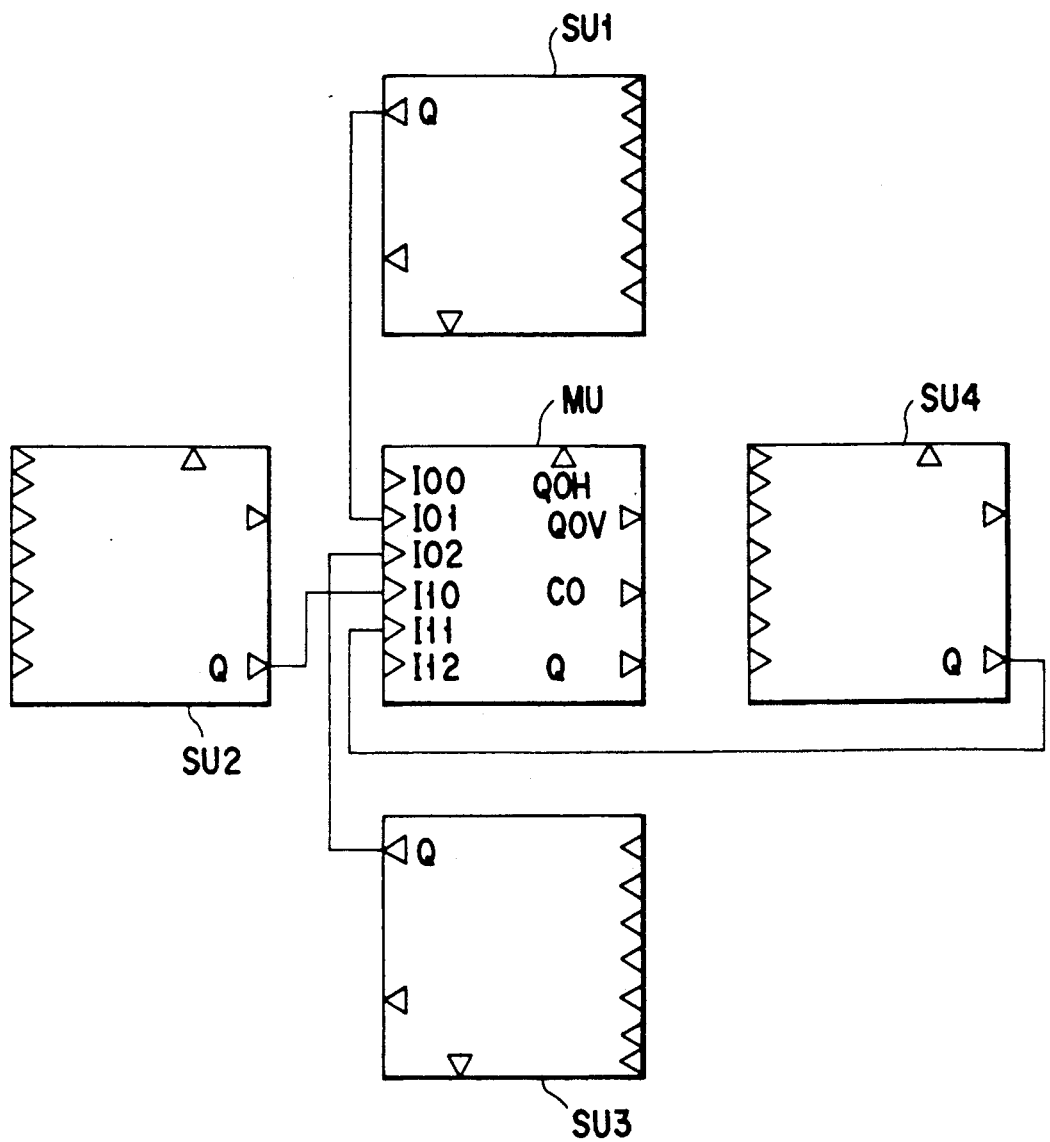
F I G. 13

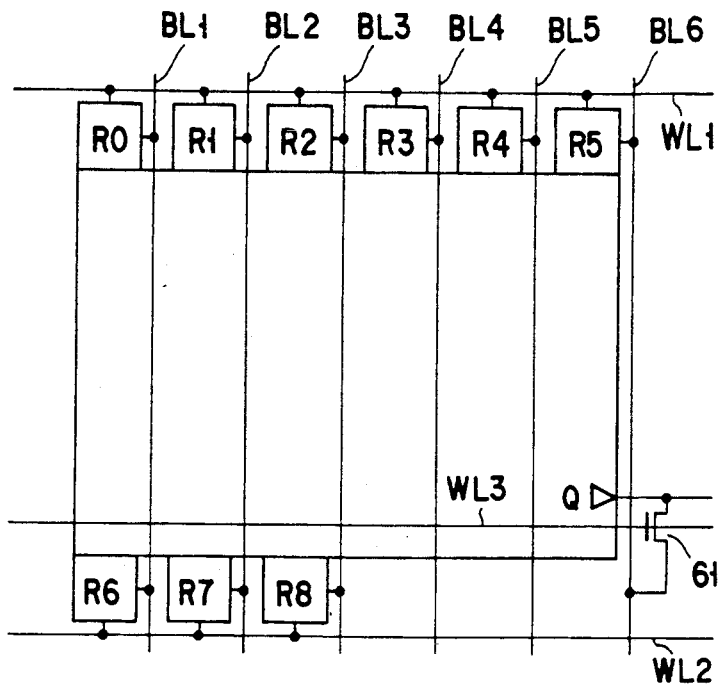
F I G. 16
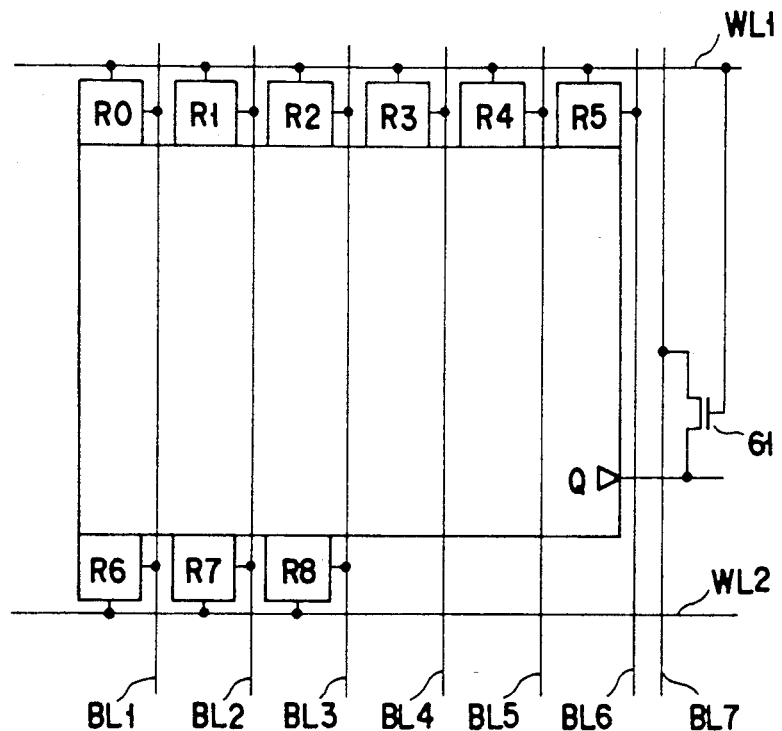
F I G. 17

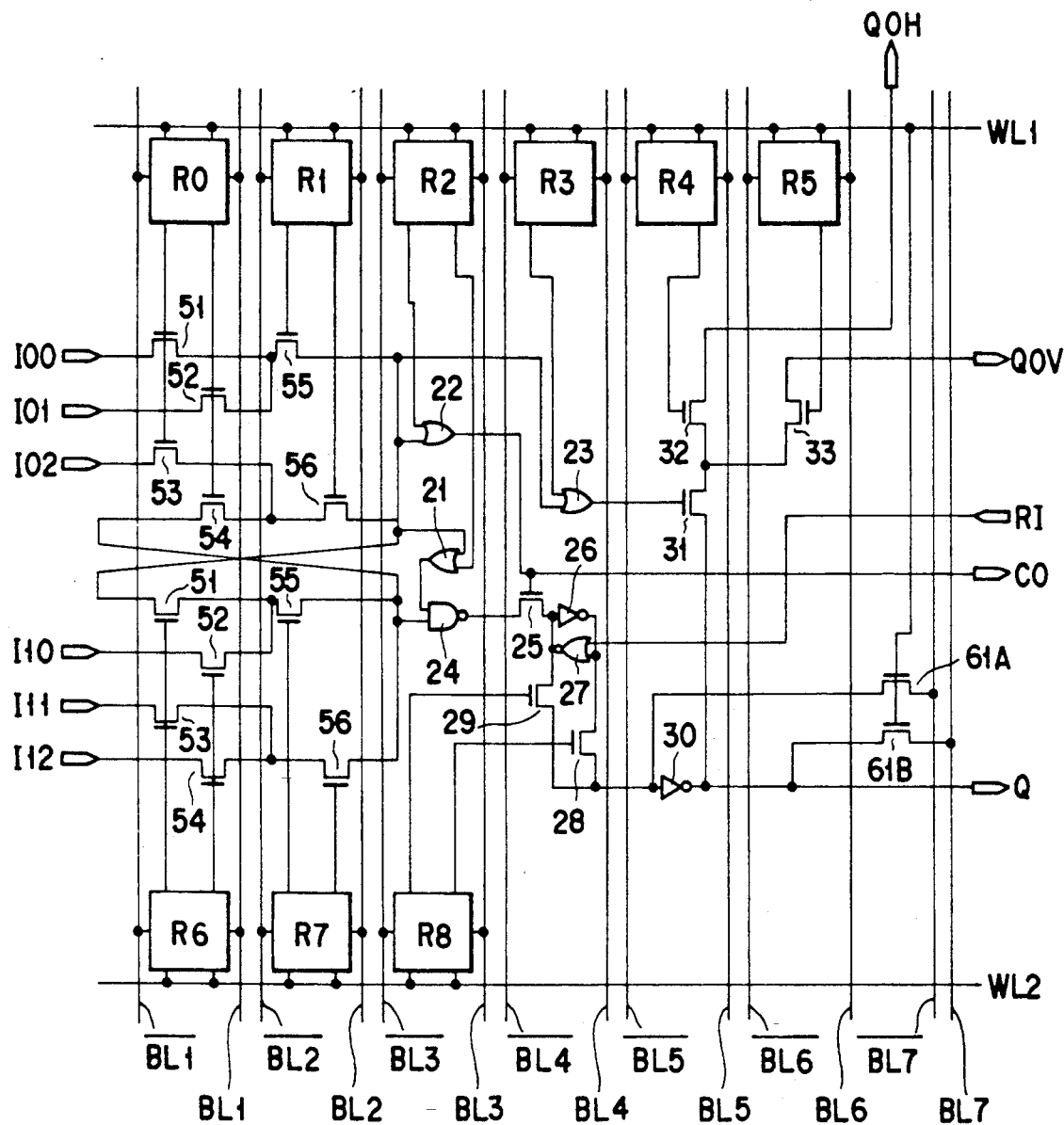
F I G. 21

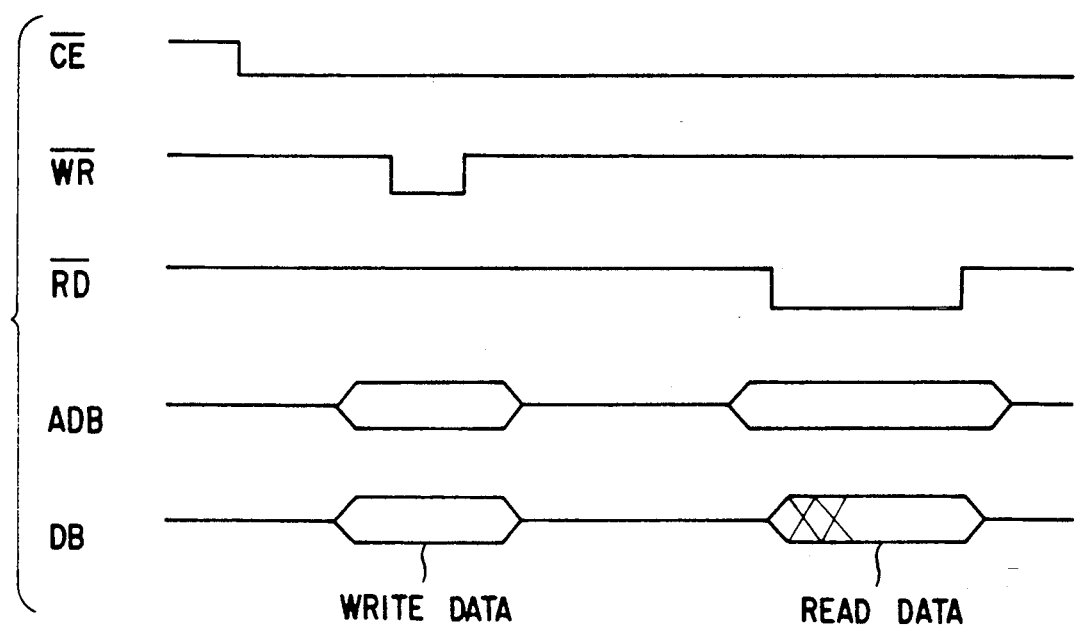
F I G. 23

CONFIGURABLE LOGIC ELEMENT WITH INDEPENDENTLY CLOCKED OUTPUTS AND NODE OBSERVATION CIRCUITRY

BACKGROUND OF THE INVENTION

1. Field of the Invention

This invention relates to a semiconductor integrated circuit, and more particularly to a programmable logic unit circuit and a programmable logic circuit.

2. Description of the Related Art

There are various techniques developed to realize circuits fulfilling users' requirements using semiconductor integrated technology. A gate array is one of the most useful integrated circuits. Gate arrays, as commonly known, are integrated circuits that realize desired logic circuits by previously forming transistors in wafers and then selectively connecting those transistors with suitable metallization patterns. The connection of transistors through metal wiring is made by manufactures, almost at the last stage of the manufacturing processes of integrated circuits. This makes it possible to offer the product to the users very quickly.

However, a user may normally have to wait for several days to several weeks before he receives the product after having ordered it, since the manufacturer first receives the circuit information from the user, forms a mask pattern for metal wiring layers based on the circuit information, and then forms the integrated circuit using the mask. Should the user have given the wrong circuit information to the manufacturer by mistake, the produced integrated circuits cannot be used. To correct the error, it is necessary to design a new integrated circuit from scratch A field programmable gate array (FPGA) has been developed to eliminate this problem. FPGAs allow the user himself to program them to realize the desired circuit without presenting the circuit information to the manufacturer. One of the features of gate arrays is that a selective metal wiring provides a desired logic circuit, as described earlier. By previously forming many wires and internal switches in an integrated circuit and then selectively connecting them through the internal switches, it is possible for the integrated circuit to emulate the same function as a conventional gate array.

One of such FPGAs is disclosed in U.S. Pat. Nos. 4,706,216 and 4,758,985. Specifically, the former discloses a unit circuit that is constructed of a memory circuit consisting of shift registers, a combinational logic circuit, a temporary storage circuit (a D flip-flop), and select circuits. The latter discloses a unit circuit that is constructed of a memory circuit consisting of shift registers, a combinational logic circuit, a temporary storage circuit (a D flip-flop), and select circuits. It also discloses a circuit configuration of these circuit units arranged in matrix form.

What should be kept in mind in developing such FPGAs is the size of the unit circuit and the design of the program memory circuit.

The above-described FPGA unit circuit provides a wide variety of combinational logic circuits and it has the state of the unit circuit's internal nodes requires more circuits, which would increase the size further. A larger-scale unit circuit has the advantage of realizing more types of circuits with a single unit, but has the disadvantage of being less suitable for integrating a number of unit circuits due to a corresponding increase in the circuit area. In addition, if the desired logic circuit is a simple combinational logic circuit, the number of unused circuits in the unit circuit exceeds that of operating circuits, resulting in a lot of waste.

On the other hand, in the shift registers of a memory circuit, serial data transfer takes a long time to send a large volume of data. In addition, when part of the data in the memory circuit needs to be rewritten, or part of the data needs to be read, all of the data has to be transferred again.

SUMMARY OF THE INVENTION

Accordingly, an object of the present invention is to provide a programmable logic unit circuit and a programmable logic circuit that are most suitable for constructing a field programmable gate array.

The foregoing object is accomplished by providing a programmable logic unit circuit comprising: a combinational logic circuit which is supplied with at least two input signals and produces a particular logic output signal from those input signals; at least two input select circuits for selecting the at least two input signals supplied to the combinational logic circuit from more than two input signals based on first selecting data; a clock-synchronized circuit which latches the output signal from the combinational logic circuit and outputs it upon receipt of a clock signal; a 3-state-output type output select circuit for selectively supplying either the output signal of the combinational logic circuit or the output signal of the clock-synchronized circuit depending on second selecting data; and a data memory circuit for storing at least the first and second selecting data.

In the programmable logic unit circuit, the input signals are selected by the input select circuits based on the data stored in the data memory circuit and are supplied to the combinational logic circuit. Similarly, based on the stored data in the data memory circuit, the output select circuit selects either the output signal of the combinational logic circuit or the output signal of the clock-synchronized circuit. Accordingly, a desired logic circuit can be achieved according to the data stored in the data memory circuit.

Additional objects and advantages of the invention will be set forth in the description which follows, and in part will be obvious from the description, or may be learned by practice of the invention The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram of a master unit circuit according to an embodiment of the present invention;

FIG. 2 is a block diagram of a slave unit circuit according to an embodiment of the present invention;

FIG. 7A shows the block diagram symbol for the master unit circuits of FIGS. 3 and 5;

FIG. 7B shows the block diagram symbol for the slave unit circuits of FIGS. 4 and 6;

FIG. 8 is a concrete circuit diagram of the RAM cell used in the circuits of FIG. 3 to FIG. 6;

FIG. 9 is another concrete circuit diagram of the RAM cell used in the circuits of FIG. 3 to FIG. 6;

FIG. 12 is a circuit diagram of a D flip-flop circuit including of the master unit circuit of FIG. 3 or FIG. 5 and the slave unit circuit of FIG. 4 or FIG. 6;

FIG. 13 is a block diagram of a master unit circuit, centering around the portion containing short-distance wiring associated with the inputs;

FIG. 16 is a circuit diagram of a programmable logic unit containing a signal observing means;

FIG. 17 is another circuit diagram of a programmable logic unit containing a signal observing means;

FIG. 21 is another more detailed circuit diagram of the master unit circuit of FIG. 3;

FIG. 23 is a timing chart for the operation of the system in FIG. 22.

DETAILED DESCRIPTION OF THE PREFERRED EMBODIMENTS

Figure 3:
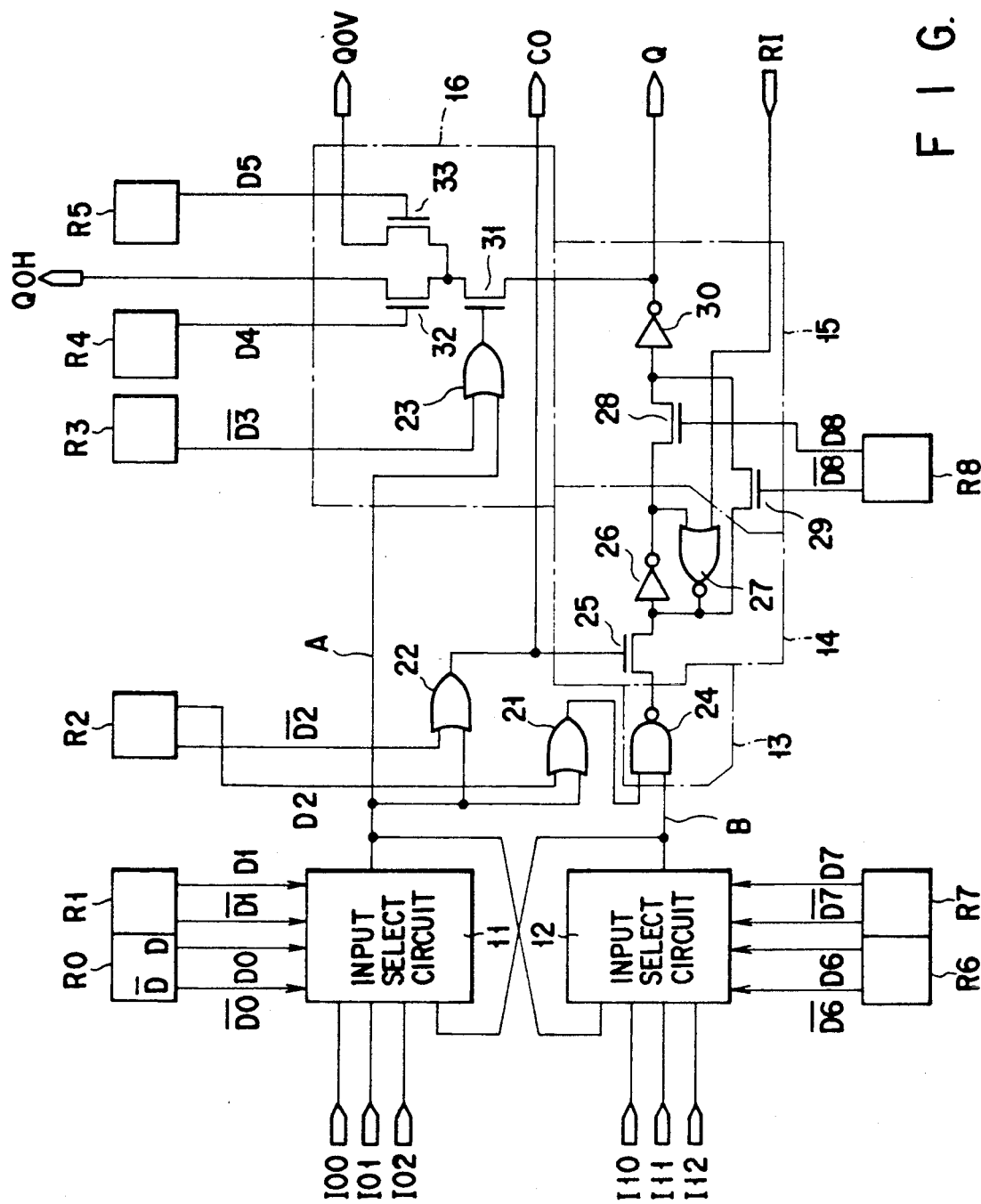
FIG. 3 is a detailed circuit diagram of the master unit circuit of FIG. 1.

Referring to the accompanying drawings, embodiments of the present invention will be explained in detail.

In a programmable logic circuit according to the present invention, a plurality of programmable logic unit circuits, which will be explained later in detail, are arranged in matrix form. The individual unit circuits are systematically connected to each other by wiring. The unit circuits are basically of two types: master unit circuits and slave unit circuits.

FIG. 1 is a schematic diagram of a master unit circuit. The master unit circuit includes a data memory circuit 10, two input select circuits 11 and 12, a 2-input combinational logic circuit 13, a clock-synchronized circuit 14 containing a latch circuit, a polarity select circuit 15, and an output select circuit 16.

One input select circuit 11 selects input A from N inputs I0 (N is a positive integer) to supply it to the combinational logic circuit 13, depending on the stored data in the data memory circuit 10. Similarly, the other input select circuit 12 selects input B from M inputs I1 (M is a positive integer) to supply it to the combinational logic circuit 13, depending on the stored data in the data memory circuit 10. Based on the previously set logical state, the combinational logic circuit 13 accepts the two logic signals A and B. The output of this logic circuit 13 is supplied to the clock-synchronized circuit 14, which synchronizes the output of the logic circuit 13 with a clock signal. Use of the clock-synchronized circuit 14 makes it easy to construct a sequential circuit, which is useful in circuit design. Input A selected from the inputs I0 is used as the clock signal to the clock-synchronized circuit 14. Therefore, input A serves as both the input to the combinational logic circuit 13 and the clock signal to the clock-synchronized circuit 14. The clock signal supplied to clock-synchronized circuit 14 is supplied as the clock output CO to related circuitry outside the master unit circuit. The clock-synchronized circuit 14 is also supplied with a reset input signal RI to reset the internal latch circuit.

The output of the clock-synchronized circuit 14 is supplied to the polarity select circuit 15. The polarity select circuit 15 supplies either the same polarity output as the clock-synchronized circuit 14, or the inverted polarity. This selecting action is controlled according to the stored data in the data memory circuit 10. The output Q of the polarity select circuit 15 is supplied to related circuits outside the master unit circuit.

The output Q of the polarity select circuit 15 is also supplied to the output select circuit 16, to which input A and the stored data in the data memory circuit 10 are also supplied. The output select circuit 16 selectively supplies at least one output terminal from K output terminals (K is a positive integer), with the output Q of the polarity select circuit 15. This selecting action is controlled according to the stored data in the data memory circuit 10. The output select circuit 16 may allow more than one output terminal to be supplied with the output Q. The output is, hereinafter, referred to as Q0. The output Q0 of the output select circuit 16 can go to a high-impedance state as well as to a "1" level or a "0" level. Because of this, the output select circuit 16 has a 3-state output.

FIG. 2 is a schematic block diagram of the slave unit circuit. The slave unit circuit, like the master unit circuit, includes a data memory circuit 10, two input select circuits 11 and 12, a 2-input combinational logic circuit 13, a clock-synchronized circuit 14, a polarity select circuit 15, and an output select circuit 16. The slave unit circuit differs from the master unit circuit in the clock signal to the clock-synchronized circuit 14. That is, in the slave unit circuit, an externally input clock signal CI is supplied as the clock signal to the clock-synchronized circuit 14 The clock signal CI is the clock signal CO supplied from the master unit circuit. The output of the input select circuit 11 is the input to the clock-synchronized circuit 14 which resets the latch in the slave unit circuit. This reset signal is supplied as a reset output signal RO to a related circuit outside the slave unit circuit.

FIG. 3 illustrates a detail structure of the master unit circuit of FIG. 1. This master unit circuit is provided with several MOS switches, gate circuits, and the like, in addition to the circuits of FIG. 1. Nine RAM cells R0 to R8 constitute the data memory circuit 10.

A first input select circuit 11 selects one from three external inputs I00 to I02 and the output of a second input select circuit 12, while the second input select circuit 12 selects one from three external inputs I10 to I12 and the output of the first input select circuit 11. Thus, N=M=4 in this example. The input selecting action at the first input select circuit 11 is determined by complementary data D0 and /D0, and D1 and /D1 read from two RAM cells R0 and R1 in the data memory circuit 10. Similarly, the input selecting action at the second input select circuit 12 is determined by complementary data D6 and /D6, and D7 and /D7 read from two RAM cells R6 and R7 in the data memory circuit 10.

Input A selected by the input select circuit 11 is supplied in parallel to one terminal of each of three OR gates 21, 22, and 23. The other terminal of OR gate 21 is supplied with data D2 read from RAM cell R2, the other terminal of OR gate 22 is supplied with data /D2 read from RAM cell R2, and the other terminal of OR gate 23 is supplied with data /D3 read from RAM cell R3.

The combinational logic circuit 13 is a 2-input NAND gate 24 in this example. The output of OR gate 21 and signal B selected by the second select circuit 12 are supplied to NAND gate 24.

The clock-synchronized circuit 14 includes MOS switch 25 one end of whose source-drain current path is supplied with the output of NAND gate 24, an inverter 26 whose input terminal is connected to the other terminal of the source-drain current path of MOS switch 25, and a 2-input NOR gate 27 whose one input terminal is supplied with the output of inverter 26, whose other input terminal is supplied with the reset input signal RI externally supplied, and whose output is returned to the input terminal of inverter 26. The gate of MOS switch 25 is supplied with the output of OR gate 22, which is also supplied as CO to related circuitry outside the unit circuit.

The polarity select circuit 15 includes MOS switch 28 one end of whose source-drain current path is connected to the output terminal of inverter 26, MOS switch 29 one end of whose source-drain current path is connected to the output of NOR gate 27, and inverter 30 whose input terminal is connected to both other ends of MOS switch 28 and MOS switch 29. The gates of MOS switches 28 and 29 are supplied with data D8 and /D8 read from the RAM cell R8, respectively. The output of inverter 30 is supplied as the signal Q to related circuits outside the unit circuit.

The output select circuit 16 includes MOS switch 31 whose source-drain current path has its one end connected to the output of inverter 30, and MOS switches 32 and 33 each of whose source-drain current path is connected at a first end to the other end of the source-drain current path of MOS switch 31. The gate of MOS switch 31 is supplied with the output of OR gate 23, and the gates of MOS switches 32 and 33 are supplied with the outputs D4 and D5 from RAM cells R4 and R5, respectively. A second end of the source-drain current path of MOS switch 32 supplies a signal Q0H, and the a second end of the source-drain current path of MOS switch 33 supplies a signal Q0V. Therefore, the output select circuit 16 has two output terminals that is, the number K of outputs equals 2. The master unit circuit thus constructed is preferably represented by a symbol shown in FIG. 7A, hereinafter.

Figure 4:
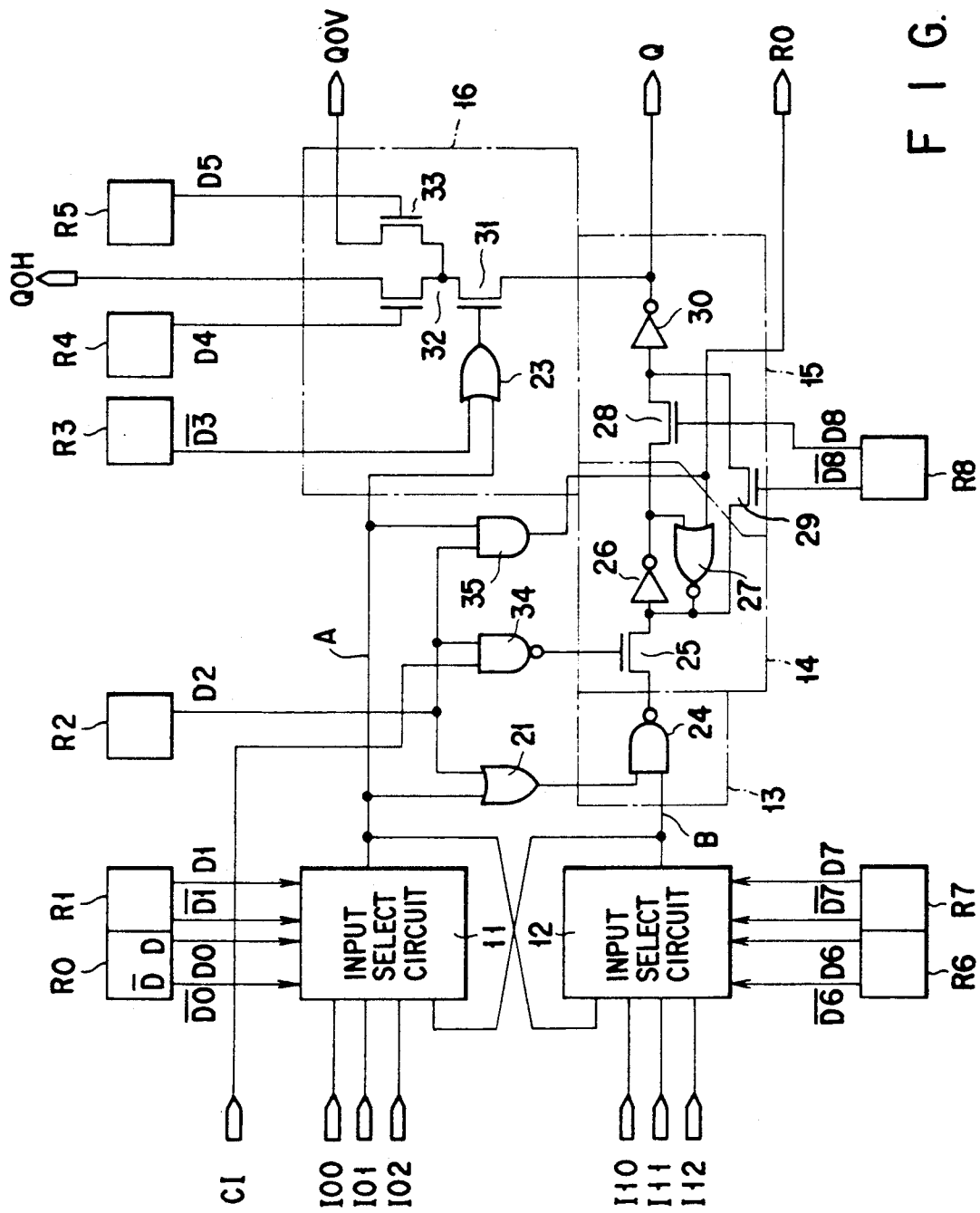
FIG. 4 is a detailed circuit diagram of the slave unit circuit of FIG. 2.

FIG. 4 illustrates the structure of the slave unit circuit of FIG. 2 in detail. This slave unit circuit differs from the master unit circuit in FIG. 3 in that 2-input NAND gate 34 is provided in place of OR gate 22 and that additional 2-input AND gate 35 is provided. A clock input signal CI and the D output D2 of RAM cell R2 are supplied to NAND gate 34, whose output is supplied to the gate of MOS switch 25 in the clock-synchronized circuit 14. Signal A and the D output D2 of RAM cell R2 are supplied to AND gate 35, whose output is supplied to one end of NOR gate 27 in the clock-synchronized circuit 14, and is supplied as a reset output signal RO to related circuits outside the unit circuit The slave unit circuit thus constructed is preferably represented by a symbol shown in FIG. 7B, hereinafter. The MOS switches used in the master unit circuit and the slave unit circuit are made up of, for example, n-channel type MOS transistors.

The operation of the master unit circuit and slave unit circuit constructed as described above will be explained. In these unit circuits, various types of functional control may be performed as follows, based on the stored data in the nine RAM cells R0 to R8 in the data memory circuit 10:

(1) Selecting one input as signal A from N inputs to input select circuit 11.

(2) Selecting one input as signal B from M inputs to input select circuit 12.

(3) Determining whether to use signal A as the input to the combinational logic circuit 13, as the control signal for the 3-state output of the output select circuit 16 in each of the master unit circuit and the slave unit circuit, as the clock signal to the clock-synchronized circuit 14, in the master unit circuit, or as the reset signal to the clock-synchronized circuit 14 in the slave unit circuit.

(4) Selecting the polarity in the polarity select circuit 15.

(5) Determining which output terminal of K output terminals in the output select circuit 16 supplies the output Q.

Selection of inputs A and B at the select circuit 11 and 12 in items (1) and (2) is made based on the stored data in RAM cells R0 and R1 and RAM cells R6 and R7.

Control in item (3) is performed as follows. Signal B is supplied to one input of NAND gate 24 acting as the combinational logic circuit. The other input of NAND gate 24 is supplied with signal A via OR gate 21, not directly with signal A itself. The reason for this is that, as mentioned earlier, input A is not only supplied to the input of the combinational logic circuit 13, but also used as the clock signal for the clock-synchronized circuit 14 in the master unit circuit, and as the reset signal for the clock-synchronized circuit 14 in the slave unit circuit. Therefore, to use input A as the clock signal to the clock-synchronized circuit 14 in the master unit circuit, or as the reset signal to the clock-synchronized circuit 14 in the slave unit circuit, input A must be separated from the input of NAND gate 24. The use of input A as either a clock signal or a reset signal is determined by the stored data in RAM cell R2. Specifically, when the stored data is at the "1" level, input A is used as a clock signal or a reset signal. On the other hand, when the data is at the "0" level, input A is not used as a clock signal or a reset signal.

When input A is used as a clock signal in the master unit circuit of FIG. 3, the output of OR gate 21 goes to a "1" level independently of input A, causing the NAND gate 24 to invert input B. With the reset input signal RI being a "0," the latch circuit composed of inverter 26 and NOR gate 27 can latch the signal transferred via MOS switch 25. When input A has been selected as a clock signal, the /D output /D2 of RAM cell R2 is at the "0" level, allowing OR gate 22 to supply input A as clock signal to the gate of MOS switch 25. MOS switch 25 then turns on, allowing the output of NAND gate 24 to be supplied to the latch circuit. In this case, the clock-synchronized circuit 14 acts as a clock-synchronized latch circuit with an input of /B ANDed with the clock signal of A. If input A is not used as clock signal, /D2 goes to the "1" level, and the output of OR gate 22 goes to the "1" level independently of input A, causing the MOS switch 25 to remain in the "on" state. Because of this, the clock synchronizing function is lost, and the clock-synchronized circuit 14 acts just as a combinational circuit.

In the slave unit circuit of FIG. 4, when input A is used as a reset signal, the output of OR gate 21 goes to a "1" level, irrespective of input A, causing NAND gate 24 to invert input B, as with the master unit circuit in FIG. 3. With input A selected as a reset signal, the D output D2 of RAM cell R2 is in the "1" level, allowing AND gate 35 to supply input A to one input terminal of NOR gate 27 in the clock-synchronized circuit 14 so that when input A is at the "1" level, the output of AND gate 35 operates as the reset signal. This enables the output of NOR gate 27 to be at the "0" level and the output of the inverter 26 to be the "1" level without ambiguity, which resets the latch circuit made up of inverter 16 and NOR gate 27. The output of AND gate 35 is supplied as a reset output signal RO to the outside world. If input A is not used as reset signal, D2 goes to the "0" level, permitting the output of AND gate 35 to go to the "0" level, irrespective of input A, which has no effect on the output of NOR gate 27.

The reason why the input select circuits 11 and 12 use each other's outputs A and B as one of their inputs will be explained. A case will be considered where input I10 is just inverted to produce output Q. This case means that the logical state of the combinational logic circuit 13 is changed from NAND logic to NOT logic. In this example, the clock signal is not necessary, and input A is selected by the input select circuit 11 as the input signal to the NAND gate 24. The input select circuit 12 selects I10 as input B. One method of obtaining the inverted signal of input B at the output of NAND gate 24 is to configure inputs A and B to be equal to each other. To achieve this, input B is supplied as one input to the input select circuit 11 and stored data in RAM data cells R0 and R1 control the input select circuit 11 to pass the signal at input B through the input select circuit 11 to become the signal at input A. This is why the select circuits 11 and 12 use each other's output as one of their inputs.

Figure 5:
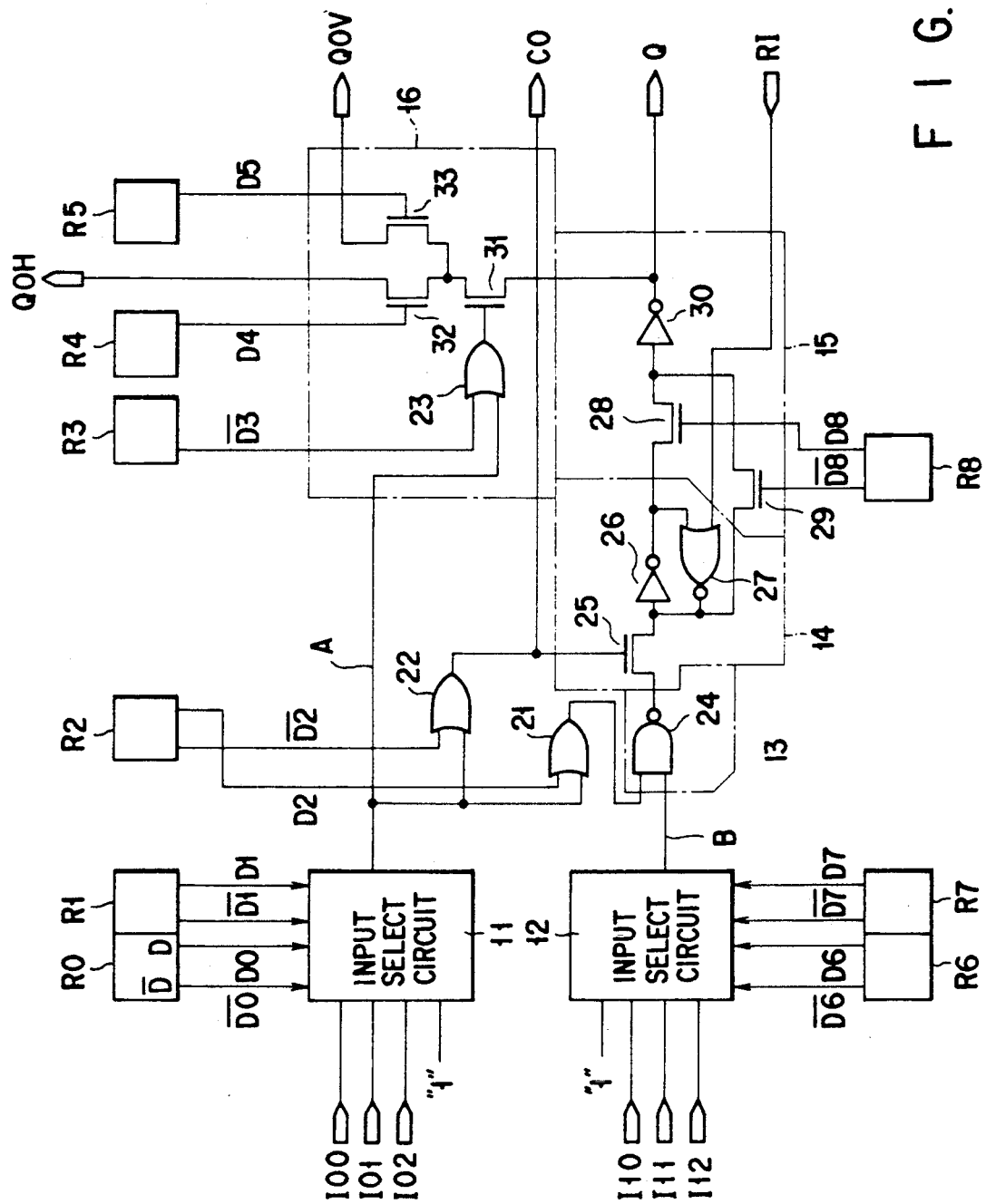
FIG. 5 is another detailed circuit diagram of the master unit circuit of FIG. 1.
Figure 6:
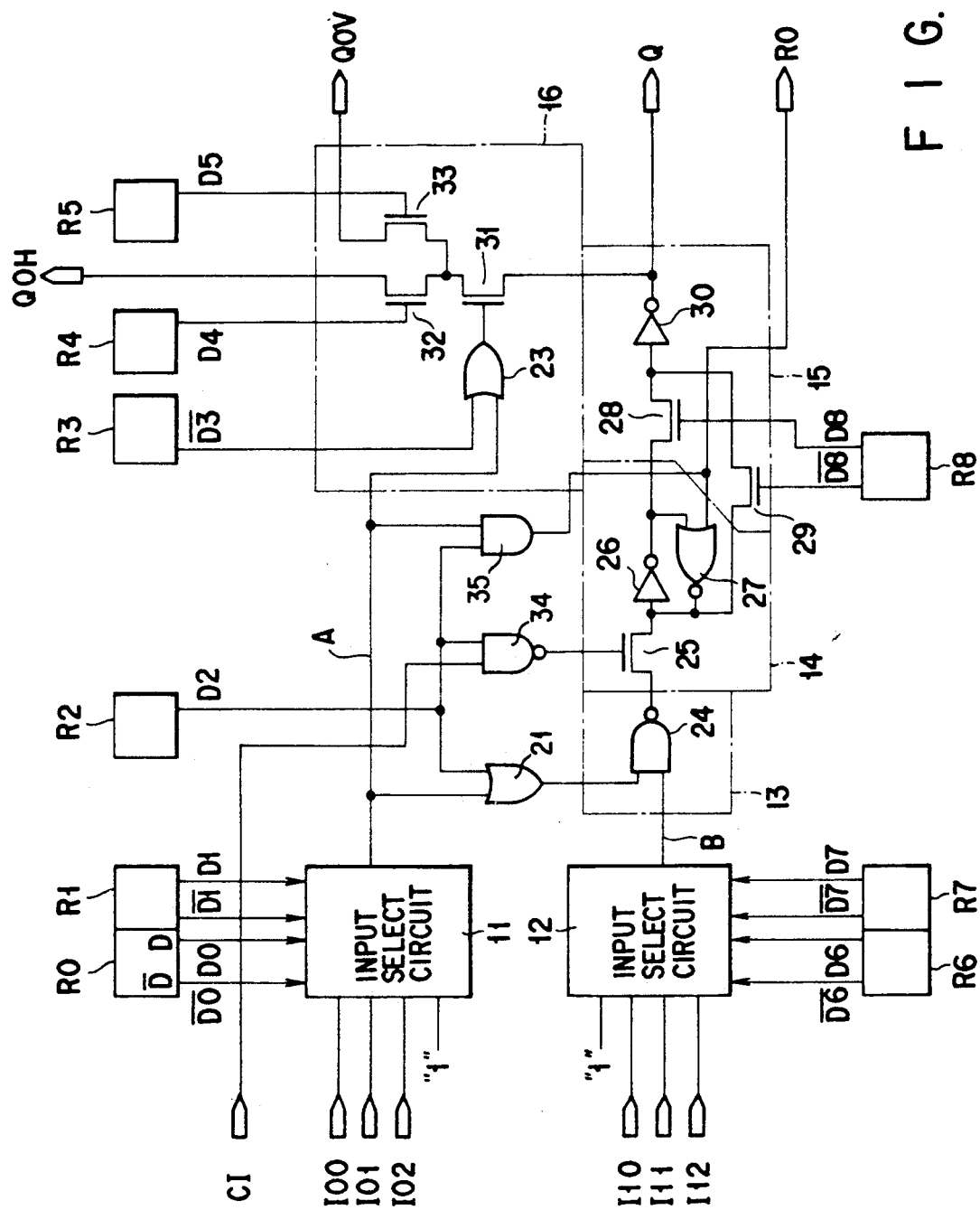
FIG. 6 is another detailed circuit diagram of the slave unit circuit of FIG. 2.

To change the logical state of the combinational logic circuit 13 from NAND logic to NOT logic, the master unit circuit may be changed to the arrangement in FIG. 5, and the slave unit circuit to the arrangement in FIG. 6. Specifically, in the master unit circuit in FIG. 3, to change the logical state of the combinational logic circuit 13 from NAND logic to NOT logic, the outputs A and B of the input select circuits 11 and 12 are selected as each other's inputs. Instead of supplying the output B of the input select circuit 12 to the input select circuit 11 and the output A of the input select circuit 11 to the input select circuit 12, a "1" level logic signal may be supplied to both input select circuits 11 and 12. In the slave unit circuit in FIG. 6, a "1" level logic signal is supplied to both input select circuits 11 and 12 for similar purposes. When a NOR gate is used for the combinational logic circuit 13 instead of NAND gate, a "0" level logic signal may be supplied as an input to both input select circuits 11 and 12. The master unit circuit in FIG. 5 is preferably represented by a block diagram symbol shown in FIG. 7A, and the slave unit circuit in FIG. 6 is preferably represented by a block diagram symbol shown in FIG. 7B.

The output of each of inverter 26 and NOR gate 27 in the clock-synchronized circuit 14 is transferred to inverter 30 via two MOS switches 28 and 2 in the polarity select circuit 15. The two MOS switches 28 and 29 select the polarity of the output. To control this selection, the stored data in RAM cell R8 in the data memory circuit 10 is used. Specifically, when the store data in RAM cell R8 is at the "1" level, and output D8 is at the "1" level, MOS switch 28 turns on, enabling the output of inverter 26 to be transmitted to inverter 30. As a result, the output Q of the unit circuit is equal to the output of NAND gate 24, with the result that the output of NAND gate 24 is supplied in an uninverted state. In contrast, when the stored data in RAM cell R8 is at the "0" level, and /D output D8 is at the "1" level, MOS switch 29 turns on, enabling the output of NOR gate 27 to be transferred to the inverter 30. As a result, the output Q of the unit circuit is inverted with respect to the output of NAND gate 24, with the result that the output of NAND gate 24 is supplied in the inverted state.

The output select circuit 16 selectively supplies the output Q to the two output terminals and is capable of placing the output terminals at a high impedance state, which will be explained below. MOS switch 31 is for 3-state control. When the stored data in the RAM cell R3 in the data memory circuit 10 is at the "1" level, and its /D output /D3 therefore goes to the "0" level, the gate of MOS switch 31 is permitted to be supplied with the signal at input A. Thus, when input A is at of the "1" level, MOS switch 31 turns on, enabling output Q to be transferred to the connection point of two MOS switches 32 and 33. In contrast, when input A is set at the "0" level MOS switch 31 turns off, preventing output Q from being transferred.

On the other hand, when the stored data in RAM cell R3 is at the "0" level, and the /D output /D3 therefore goes to the "1" level, the output of OR gate 23 is caused to be at the "1" level independently of input A, thereby turning on MOS switch 31 constantly. In this case, based on the stored data in two RAM cells R4 and R5, two MOS switches 32 and 33 are turned on or off to determine whether or not the output of MOS switch 31 is transferred to each of Q0H and Q0V. Specifically, when the stored data in both RAM cells R4 and R5 are at the "0" level and the D outputs D4 and D5 are both at the "0" level, two MOS switches 32 and 33 both turn off, preventing output Q from being transferred to both Q0H and Q0V. When the stored data in RAM cell R4 is at the "1" level, and the output D4 is at the "1" level, the MOS switch 32 turns on, permitting output Q to be transmitted to Q0H. Similarly, when the stored data in RAM cell R5 is at the "1" level, and the output D5 is at the "1" level, the MOS switch 33 turns on, permitting output Q to be transmitted to Q0V.

FIG. 8 depicts a concrete configuration of a single RAM cell used in the data memory circuit 10 in the master unit circuit or the slave unit circuit. This cell contains two inverters 41 and 42 and two transfer gates 43 and 44. One end of the source-drain current path of each of transfer gates 43 and 44 is connected to bit line BL and /BL, respectively, with their gates both connected to word line WL. The other end of the source-drain current path of transfer gate 43 is connected to both the input terminal of inverter 41 and the output terminal of inverter 42, while the other end of the source-drain current path of transfer gate 44 is connected to both the input terminal of inverter 42 and the output terminal of inverter 41. Outputs D and /D are supplied at the output terminals of inverters 41 and 42, respectively. Therefore, this RAM cell is of the static type.

FIG. 9 shows an alternative concrete configuration of a single RAM cell used in the data memory circuit 10 in the master unit circuit or the slave unit circuit. This cell contains a data storage capacitor 45 and a capacitor select MOS switch 46 connected to word line WL and bit line BL. Outputs D and /D are obtained as the stored data in the capacitor and the output of an inverter (not shown) to which the stored data is supplied. Thus, this RAM cell is of the dynamic type.

Figure 10:
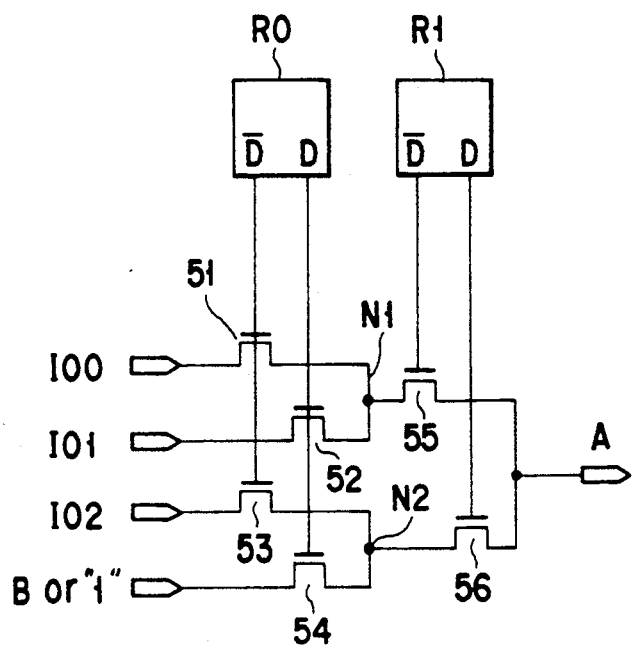
FIG. 10 is a concrete circuit diagram of the input select circuit used in the circuits of FIG. 3 to FIG. 6.

FIG. 10 illustrates a concrete arrangement of the input select circuit 11 used in the data memory circuit 10 in the master unit circuit or the slave unit circuit. The input select circuit 11, which includes six MOS switches 51 to 56, selects one from four inputs. Specifically, the source-drain current path of MOS switch 51 is inserted between the external input I00 and node N1. The source-drain current path of MOS switch 52 is inserted between the external input I01 and node N1. The source-drain current path of MOS switch 53 is inserted between the external input I02 and node N2. The source-drain current path of MOS switch 54 is inserted between input B or a "1" level logic signal and node N2. The source-drain current path of MOS switch 55 is inserted between node N1 and the node at which input A appears. The source-drain current path of MOS switch 56 is inserted between node N2 and the node supplying input A. The gates of the two MOS switches 51 and 5 are supplied with the /D output of RAM cell R0, while the gates of the two MOS switches 52 and 54 are supplied with the D output of RAM cell R0. The gates of the two MOS switches 56 and 55 are supplied with the D and /D outputs of RAM cell R1, respectively.

Depending on two bits of data stored in the two RAM cells R0 and R1, the six MOS switches 51 to 56 are selectively turned on to select one input from three external inputs I00 to I02 and input B or a "1" level logic signal. For example, when both pieces of data stored in RAM cells R0 and R1 are at the "1" level, MOS switches 54 and 56 turn on to select input B or a "1" level logic signal. Because the other input select circuit 12 is constructed in the same way as the above input select circuit 11, its explanation will be omitted.

Figure 11:
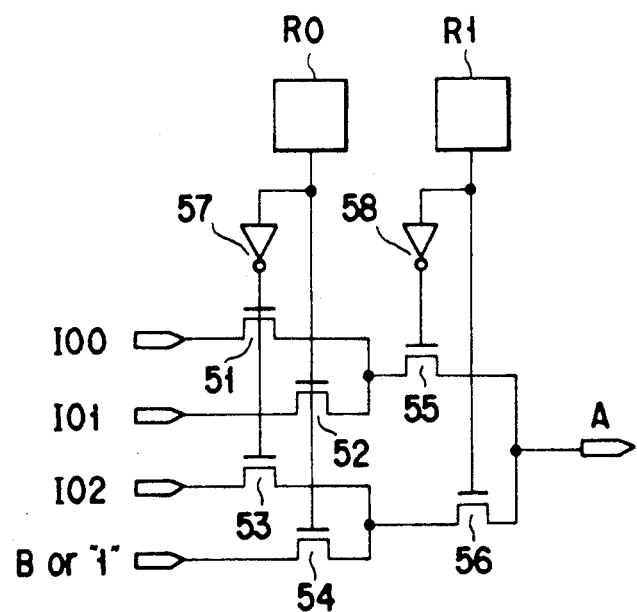
FIG. 11 is another concrete circuit diagram of the input select circuit used in the circuits of FIG. 3 to FIG. 6.

FIG. 11 illustrates another concrete arrangement of the input select circuit 11 used with the data memory circuit 10 in the master unit circuit or the slave unit circuit. In this case where the above-mentioned dynamic RAM cells are used for RAM cells R0 and R1, Here, two inverters 57 and 58 are added to the FIG. 10 circuit to obtain /D output.

The reason for use of two types of unit circuits, master and slave, is as follows. As mentioned earlier, the clock-synchronized circuit 14 in the master unit circuit contains a latch circuit. Generally, in addition to latch circuits, D flip-flops are also used very often in sequential circuits. As is commonly known, a D flip-flop is such that two stages of latch circuits are connected in series, with each clock signal in opposite phase, so that the two stages of latch circuits operate in a complemental manner. To realize a D flip-flop with unit circuits, two unit circuits, each of which has the opposite clock signal of the other, are connected in series. Thus, the master unit circuit differs from the slave unit circuit only in that the clock signal is supplied from the clock-synchronized circuit 14 or the clock signal is received at the clock-synchronized circuit 14, and in that the latch reset signal is supplied to the clock-synchronized circuit 14 or the reset signal is received at the clock-synchronized circuit 14.

An example of a D flip-flop comprised of a master unit circuit and a slave unit circuit is shown in FIG. 12. This D flip-flop uses the input I00 of the master unit circuit MU as clock input, I10 as data input, and Q of the slave unit circuit SU as the output. The input I00 of the slave unit circuit SU is used as a reset signal input, and the reset output signal RO of the slave unit circuit SU is supplied as a reset input signal RI to the master unit circuit MU. The two unit circuits are formed in the same integrated circuit An explanation will be given as to structuring groups of wires when a plurality of master unit circuits and slave unit circuits described earlier are arranged in matrix form to fabricate an FPGA (field programmable logic circuit). There are two types of wiring groups in the FPGA: groups that connect adjacent unit circuits (hereinafter, groups of this type are referred to as short-distance wiring groups) and groups that connect matrix-arranged unit circuits in rows or in columns (hereinafter, groups of this type are referred to as long-distance wiring groups).

FIG. 13 is a block diagram of a master unit circuit, the block diagram centering on a portion containing short-distance wiring groups associated with the input to the master unit circuit. Four slave unit circuits SU1 to SU4 are each placed above, below, on the right, and on the left of the master unit circuit MU. Wiring is done so that the outputs Q of the four slave unit circuits SU1 to SU4 may be the inputs I01, I10, I02, and I11 of the master unit circuit MU, respectively. The inputs I00 and I12 of the master unit circuit MU will be explained later. With this arrangement, signal transmission from the nearest unit circuit is very easy.

Figure 14:
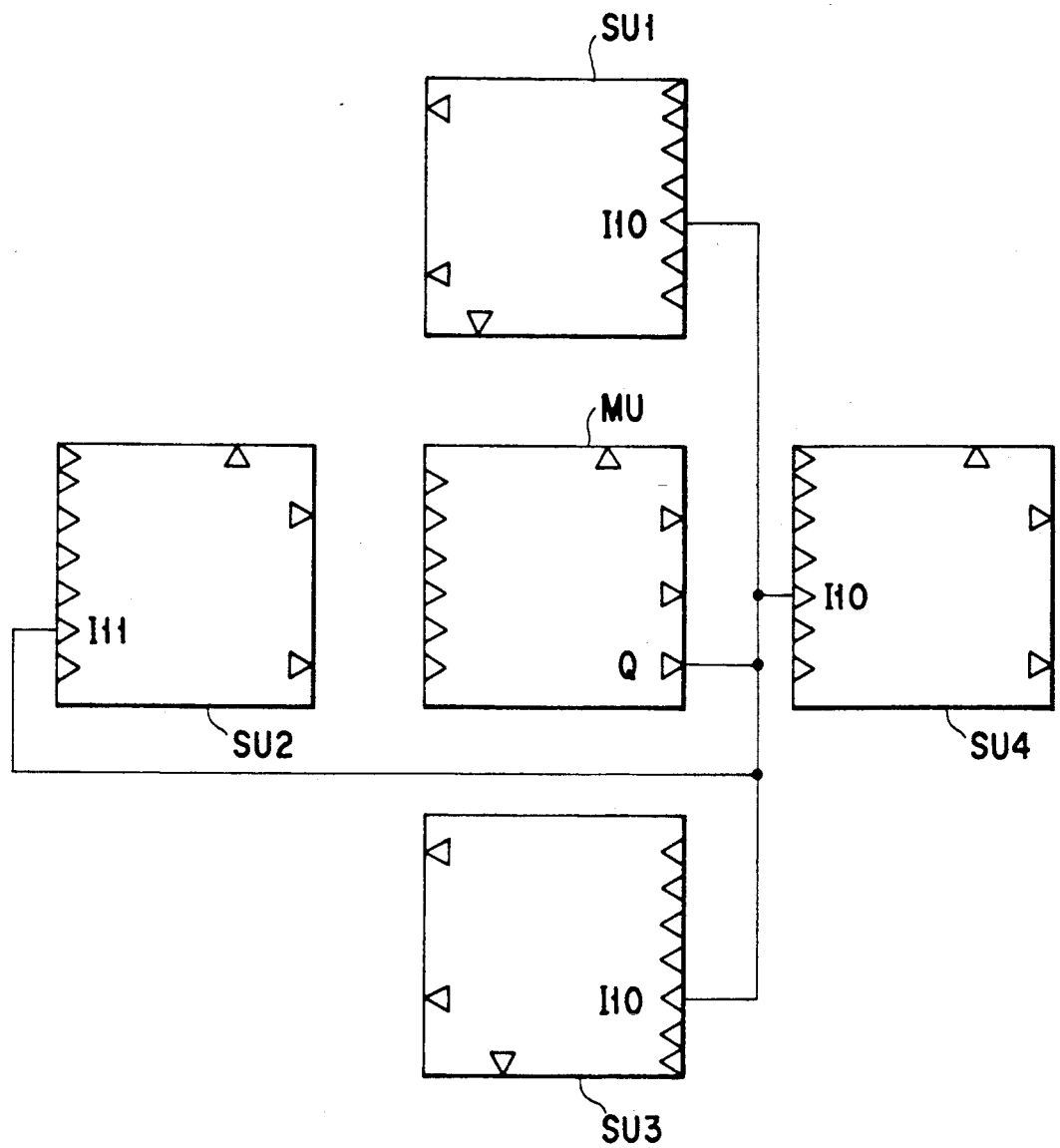
FIG. 14 is a block diagram of a master unit circuit, centering around the portion containing short-distance wiring associated with the output.

FIG. 14 is a block diagram of a master unit circuit, the block diagram centering on a portion containing short-distance wiring groups associated with the output from the master unit circuit. Four slave unit circuits SU1 to SU4 are each placed above, below, on the right, and on the left of a single master unit circuit MU. Wiring is done so that the output Q of the master unit circuit MU may be the inputs I10, I11, I10, and I10 to the four slave unit circuits SU1 to SU4.

FIGS. 13 and 1 illustrate the short-distance wiring groups, centering around the master unit circuit. The same holds true for the slave unit circuit, and its short-distance wiring groups are not shown here.

Figure 15:
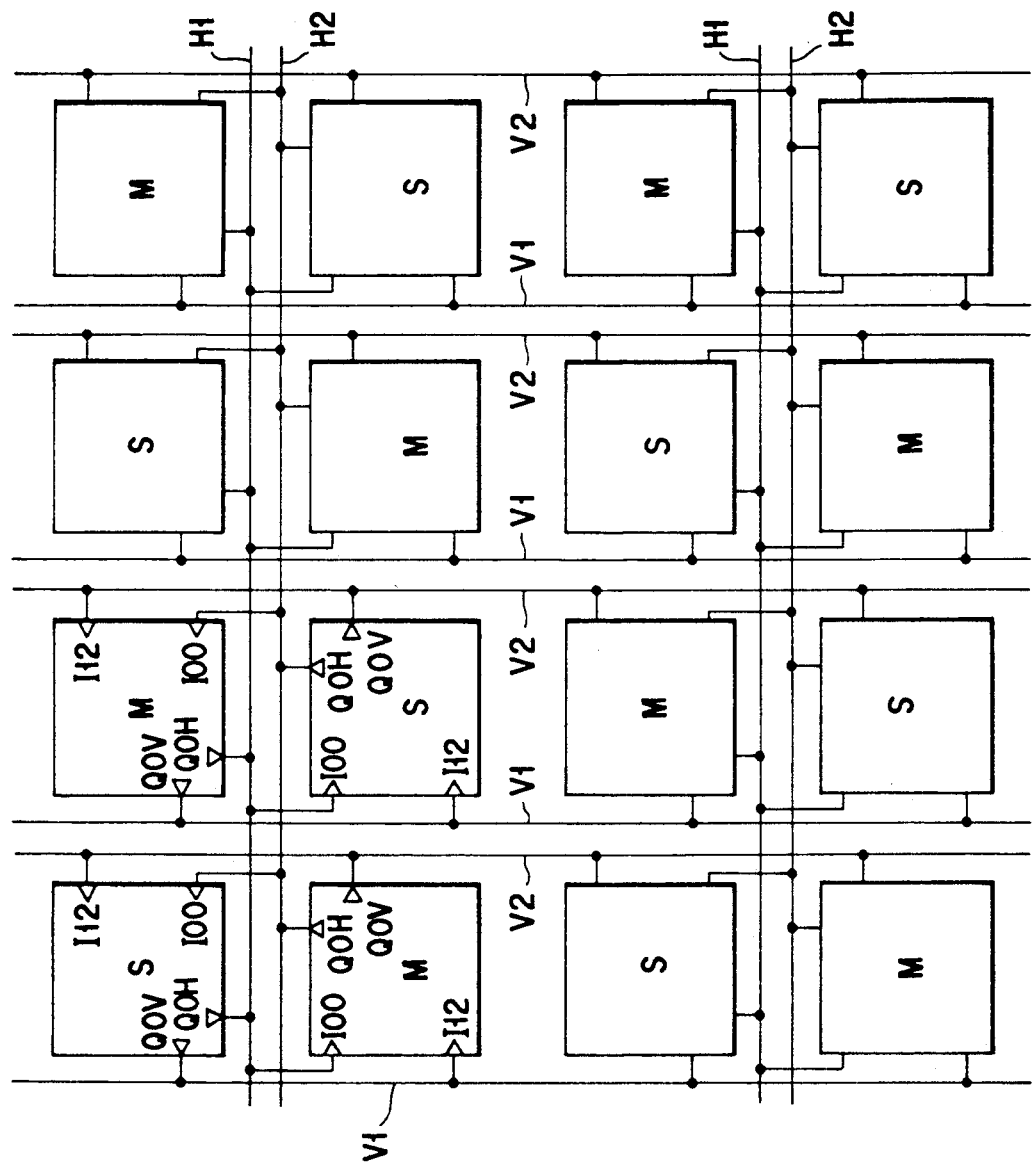
FIG. 15 is a view showing the long-distance wiring in a matrix arrangement of a plurality of master unit circuits and slave unit circuits.

The long-distance wiring groups will be explained. In FIG. 15, a plurality of master unit circuits (marked with M in the figure) and slave unit circuits (marked with S in the figure) are arranged in matrix form. In the figure, the inputs I12 and outputs Q0V of the unit circuits placed in the direction of a column are all connected to two wires V1 and V2 extending in the column direction. The inputs I00 and outputs Q0H of the unit circuits placed in the direction of a row are all connected to two wires H1 and H2 extending in the row direction.

With such long-distance wires V1, V2, H1 and H2, a unit circuit at a given position can transfer data across a dimension of more than one unit circuit. Because the outputs Q0H and Q0V of each unit circuit are of 3-state output, each long-distance wire can be used as a data bus of a microcomputer system. Specifically, since the output select circuit 16 of each unit circuit can turn on and off MOS switch 31, the unit circuits that are required to supply a signal at the output Q0H or Q0V to the wires, place their MOS switch 31 in the on state, while the unit circuits that need not supply a signal, place their MOS switch 31 in the off state. This allows the long-distance wires V1 and V2, and H1 and H2 to be shared by more than on unit circuit without interference. This feature makes it much easier to program the peripheral circuits for the microcomputer.

Explanation will be given as to a circuit configuration for observing signals, one of the important techniques of the present invention. After a given circuit function has been programmed in the FPGA, a signal is supplied to the input terminal of the FPGA and the output appears at its output terminal. If the circuit does not operate as expected, it is necessary to determine which portion is malfunctioning. In that case, observation of the node signals in each unit circuit in the FPGA enables a faster finding of defective parts. For this reason, each unit circuit of the present invention is provided with a means for observing a signal at any node.

FIG. 16 is a circuit diagram of a programmable logic unit circuit containing such a signal observing means. In the figure, reference characters R0 to R8 indicate RAM cells of FIG. 3 or FIG. 4 constituting the data memory circuit 10. The details of each RAM cell have been described in FIG. 9. Both RAM cells R0 and R6 are connected to bit line BL1, both RAM cells R1 and R7 to bit line BL2, both RAM cells R2 and R8 to bit line BL3, RAM cell R3 to bit line BL4, RAM cell R4 to bit line BL5, and RAM cell R5 to bit line BL6. RAM cells R0 to R5 are all connected to word line WL1, and RAM cells R6 to R8 are all connected to word line WL2.

An n-channel MOS switch 61 for signal observation is provided between the output Q of the unit circuit and the bit line BL6. This unit circuit has an additional word line WL3 different from the above two word lines, the word line WL3 being connected to the gate of signal observing MOS switch 61. The three word lines WL1 to WL3 are supplied with the output of an address decoder described later.

With such a configuration, to observe the output Q of the unit circuit, the signal on the word line WL3 is set to the "1" level. This turns on MOS switch 61, enabling the output Q to be read onto bit line BL6. The signal read onto bit line BL6 is supplied to related circuit outside the unit circuit by means of the circuit (not shown) for reading the stored data from each RAM.

FIG. 17 is a circuit diagram of a programmable logic unit circuit containing the signal observing means. In place of word line WL3 of FIG. 16, this unit circuit is provided with an additional bit line BL7. The signal observing MOS switch 61 is inserted between the bit line BL7 and the output Q of the unit circuit. The gate of MOS switch 61 is connected to the same word line WLI as that for selecting RAM cells R0 to R5.

In this unit circuit, when the stored data is read from RAM cells R0 to R5, the output Q of the unit circuit is read at the same time.

Explanation will be made as to a method of selecting word lines in a matrix arrangement of unit circuits of FIG. 16 or FIG. 17.

Figure 18:
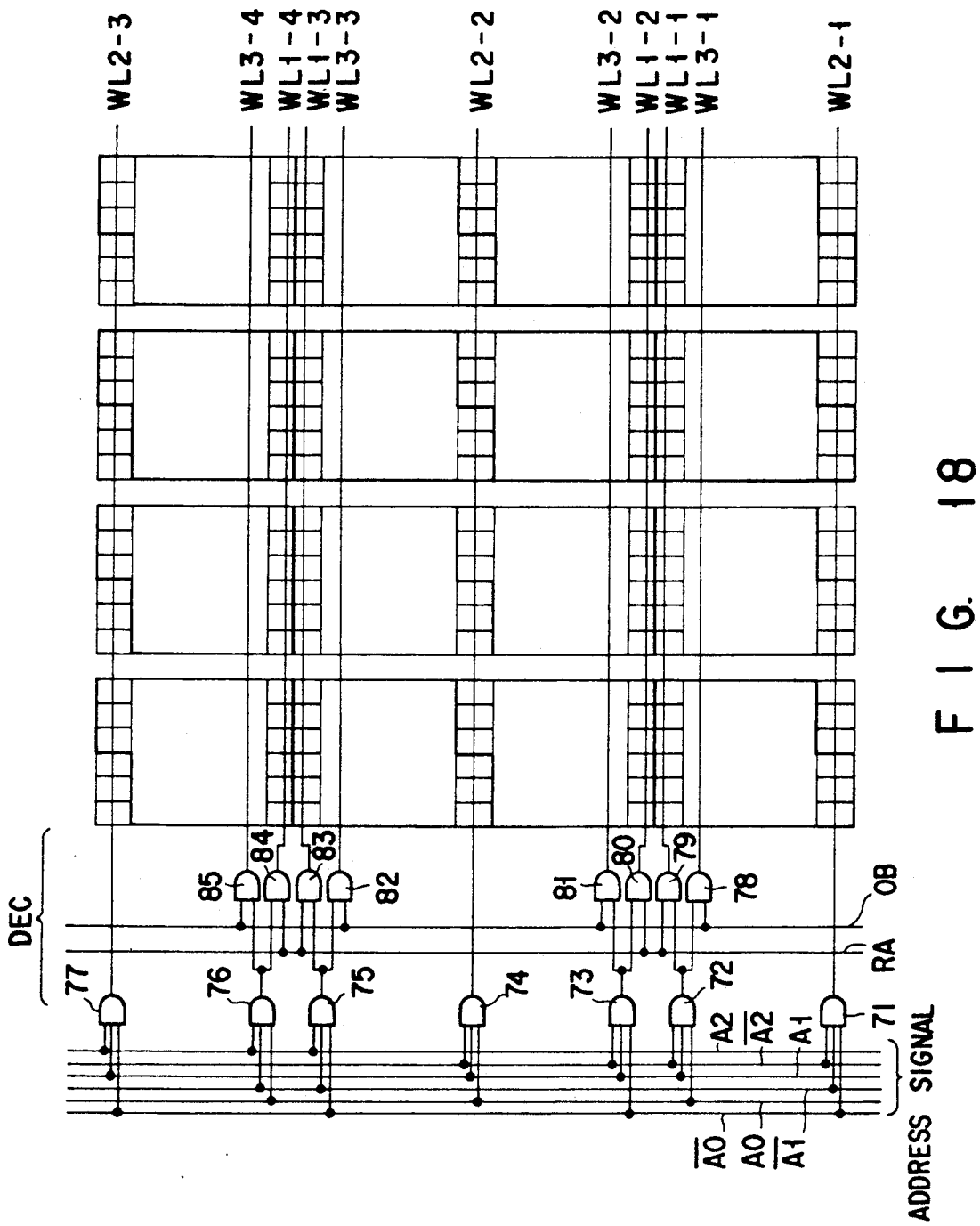
FIG. 18 is a circuit diagram of a matrix arrangement of FIG. 16 unit circuits with a decoder for selecting those circuits.

FIG. 18 shows a matrix arrangement of 16 unit circuits of FIG. 16 with a decoder DEC for selecting them, with four columns and four rows, each containing four unit circuits. Selection of the individual RAM cells in the 16 unit circuits and selection of the outputs Q of the unit circuits are based on the 3-bit complementary address signals A0 and /A0 to A2 and /A2 supplied to the decoder DEC. In the figure, word lines WL1-1 to WL1-4 correspond to the word line WL1 of FIG. 16. Similarly, word lines WL2-1 to WL2-3 correspond to the word line WL2, and word lines WL3-1 to WL3-4 correspond to the word line WL3.

In the figure, seven AND gates 71 to 77 to which different combinations of the 3-bit address signals A0 and /A0 to A2 and /A2 are supplied are provided to produce seven different decode outputs. The AND gates 71, 74, and 77 are provided to select RAM cells only, with their decode outputs supplied to word lines WL2-1, WL2-2, and WL2-3.

The remaining AND gates 72, 73, 75, and 76 are used to select RAM cells and the outputs Q of the unit circuits. The decode output of each of AND gates 72, 73, 75, and 76 is supplied in parallel to each pair of AND gates 78 and 79, 80 and 81, 82 and 83, and 84 and 85, respectively. Each pair of AND gates 78 and 79, 80 and 81, 82 and 83, and 84 and 85 is controlled by means of the signal RA for selecting RAM cells and the signal OB for selecting the outputs Q of the unit circuits. Specifically, when signal RA is at the "1" level, the decode output of each of AND gates 72, 73, 75, and 76 is transmitted to the AND gates 79, 80, 83, and 84, respectively, and is supplied to word lines WL1-1 to WL1-4, respectively. When signal OB is at the "1" level, the decode output of each of AND gates 72, 73, 75, and 76 is transmitted to the AND gates 78, 81, 82, and 85, respectively, and is supplied to word lines WL3-1 to WL3-4, respectively.

Figure 19:
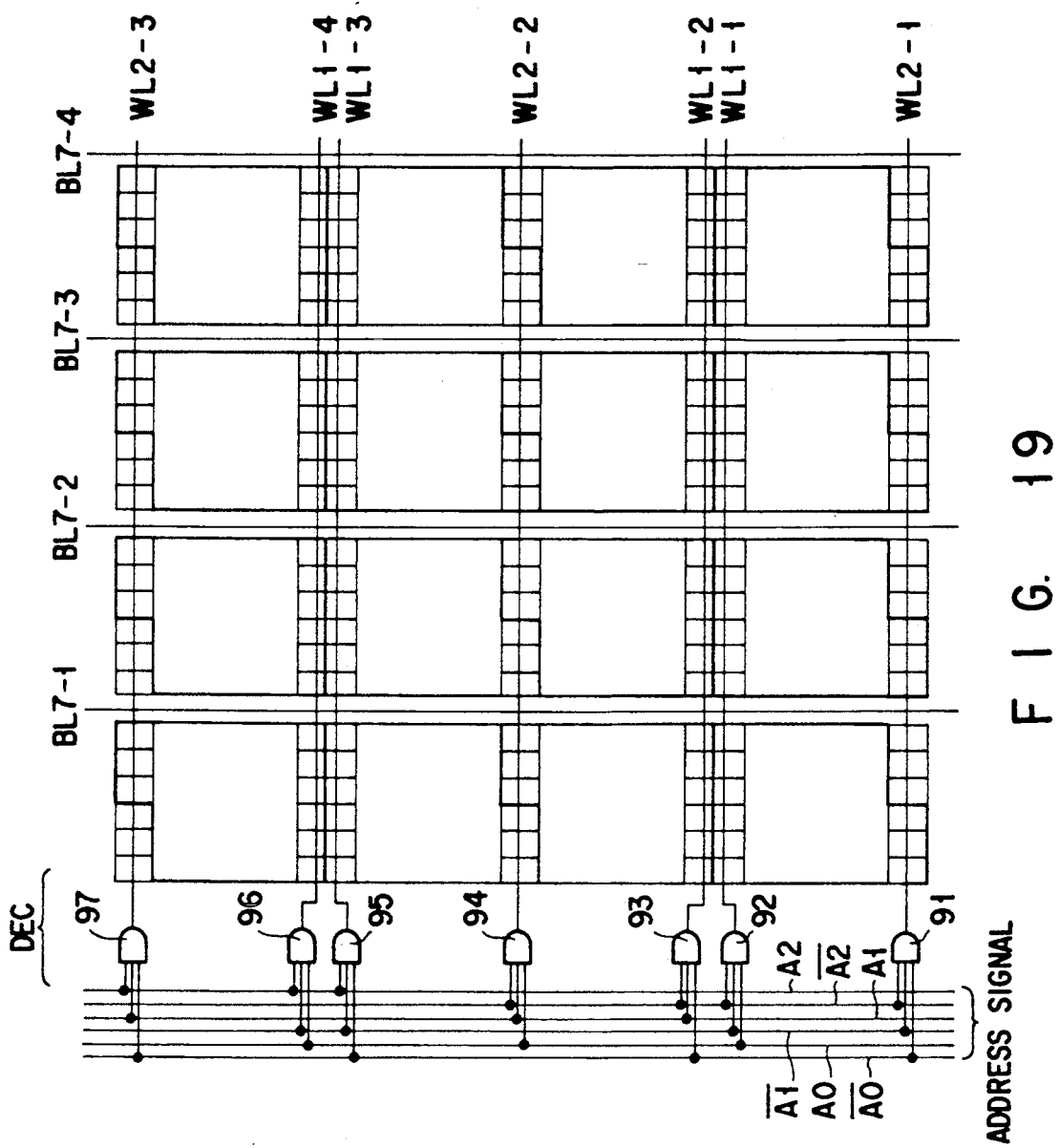
FIG. 19 is a circuit diagram of a matrix arrangement of FIG. 17 unit circuits with a decoder for selecting those circuits.

FIG. 19 shows a matrix arrangement of 16 unit circuits of FIG. 17 with a decoder DEC for selecting them, with four columns and four rows, each containing four unit circuits. Selection of the individual RAM cells in the 16 unit circuits and selection of the outputs Q of the unit circuits are based on the 3-bit complementary address signals A0 and /A0 to A2 and /A2. In the figure, word lines WL1-1 to WL1-4 correspond to the word line WL1 of FIG. 17. Similarly, word lines WL2-1 to WL2-3 correspond to the word line WL2.

In the figure, seven AND gates 91 to 97 to which different combinations of the 3-bit address signals A0 and /A0 to A2 and /A2 are supplied are provided to produce seven different decode outputs, with their decode outputs supplied to word lines WL2-1, WL1-1, and WL1-2, WL2-2, WL1-3, WL1-4, and WL2-3.

In this example, four bit lines BL7-1 to BL7-4 corresponding to the bit line BL7 are provided to read the output of each unit circuit.

Figure 20:
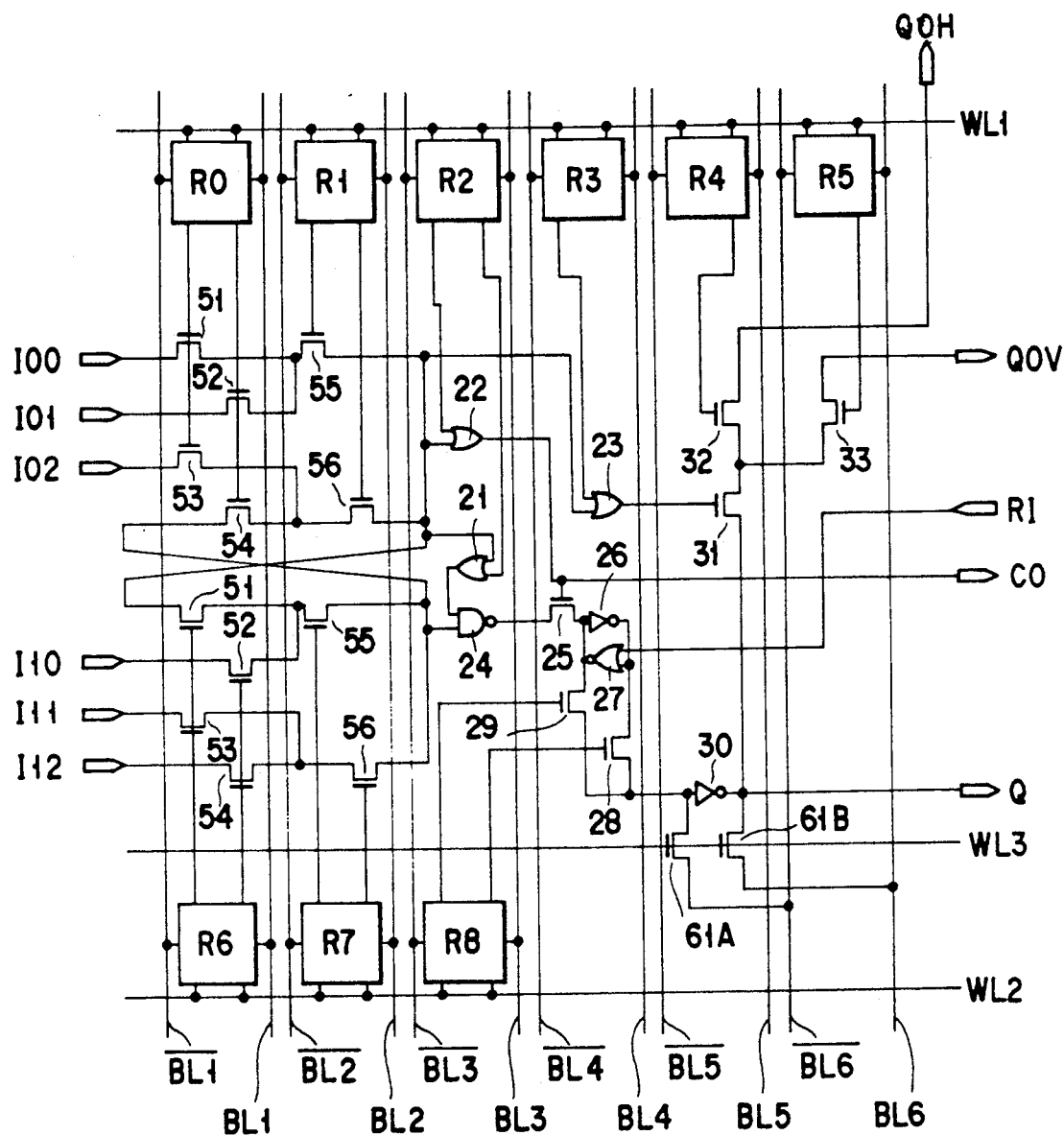
FIG. 20 is a more detailed circuit diagram of the master unit circuit of FIG. 3.

FIG. 20 is a detailed circuit diagram of an entire master unit circuit, whose RAM cells R0 to R8 are of the static type as shown in FIG. 8, whose input select circuits 11 and 12 are those as shown in FIG. 10, and whose signal observing means is that as shown in FIG. 16. In this example, two MOS switches 61A and 61B corresponding to the MOS switch 61 are provided to read complementary signals as the output Q onto bit lines BL6 and /BL6. One MOS switch 61A is inserted between the input terminal of inverter 30 in the polarity select circuit 15 and the bit line /BL6, while the other MOS switch 61B is inserted between the output terminal of inverter 30 and the bit line BL6. The gates of both MOS switches 61A and 61B are connected to word line WL3 provided independently of those for selecting RAM cells R6 to R8.

FIG. 21 is a detailed circuit diagram of an entire master unit circuit, whose RAM cells RO to R8 are of the static type as shown in FIG. 8, whose input select circuits 11 and 12 are those as shown in FIG. 10, and whose signal observing means is that as shown in FIG. 17. In this example, two MOS switches 61A and 61B corresponding to the MOS switch 61 are provided to read complementary signals as the output Q onto bit lines BL7 and /BL7. One MOS switch 61A is inserted between the input terminal of inverter 30 in the polarity select circuit 15 and the bit line /BL7, while the other MOS switch 61B is inserted between the output terminal of inverter 30 and the bit line BL7. The gates of both MOS switches 61A and 61B are connected to the same word line WL1 as that for selecting RAM cells R0 to R5.

In this way, each unit circuit enables the signal Q at the output node to be read outside for observation. The node to be observed is not limited to the output node of the unit circuit. The signal at any node in the unit circuit may be observed.

The number of nodes to be observed is not restricted to only one. The signals at more than one node may, of course, be observed. The observing means shown in FIGS. 16 and 17 are not restrictive, but may be embodied in other forms.

Figure 22:
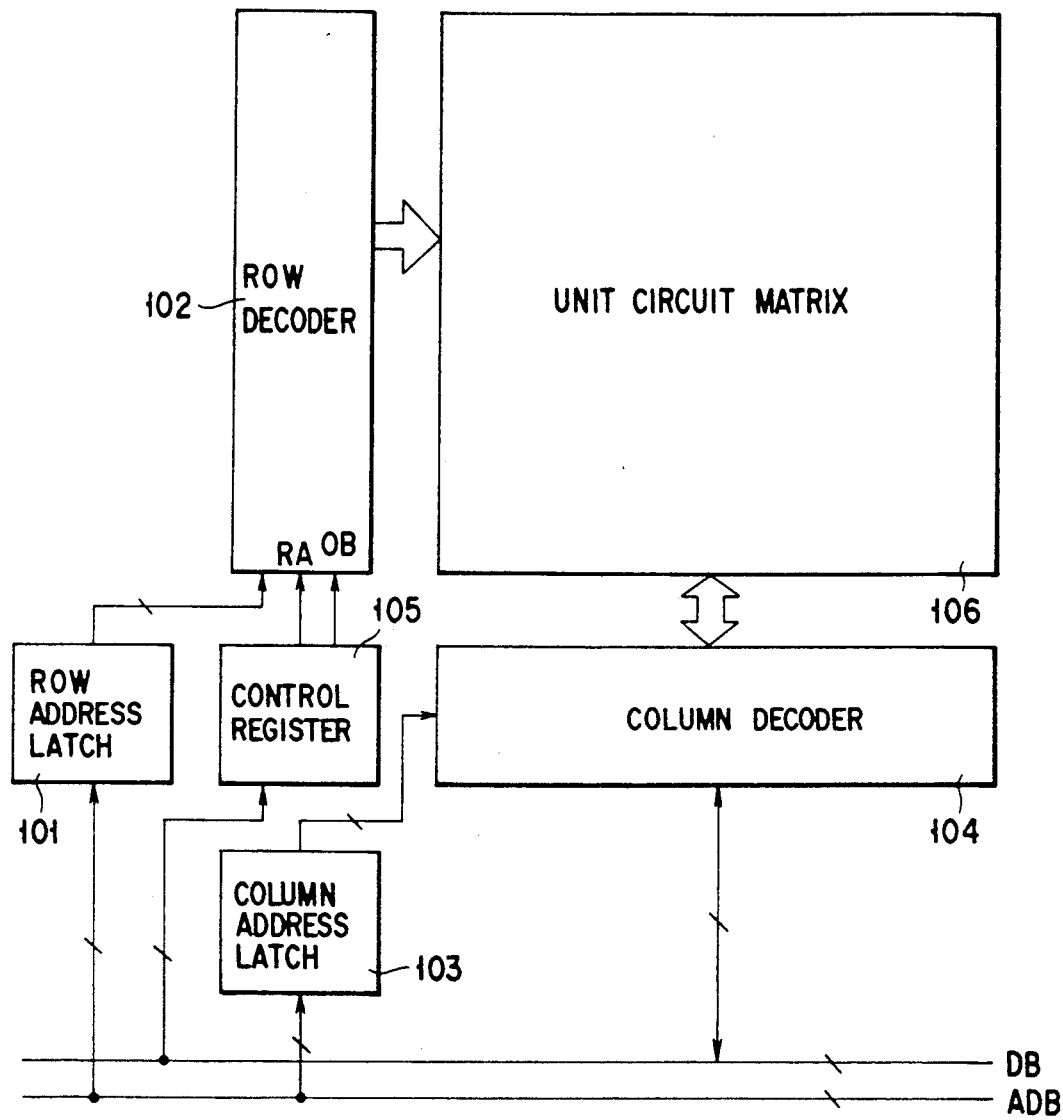
FIG. 22 is a block diagram illustrating the construction of the entire system that controls the reading of data from and the writing of data into each RAM cell in a matrix arrangement of unit circuits, and the reading of the output from each unit circuit.

FIG. 22 is a block diagram showing an entire system that controls the writing of data into and the reading of data from each RAM cell in a plurality of unit circuits arranged in matrix form, and the reading of the output Q from each unit circuit. In the figure, reference character DB indicates a data bus, and ADB an address bus. For example, in an 8-bit system, the data bus DB generally has 8 parallel signals, and the address bus has 16 parallel signals. The row address on the address bus ADB is latched in the row address latch 101, which supplies it to the row decoder 102. The column address on the address bus ADB is latched in the column address latch 103, which supplies it to the column decoder 104. The control data on the data bus DB is supplied to the control register 105. This control register 105, based on the control data, produces a signal RA for selecting RAM cells and a signal OB for selecting the outputs Q of the unit circuits. Both signals RA and OB are supplied to the row decoder 102, which is controlled by these signals. The decode outputs of the row decoder 102 and the column decoder 104 are supplied to the unit circuit matrix 106 in which a plurality of unit circuits are arranged in matrix form.

The operation of the system in FIG. 22 will be described. FIG. 23 depicts the waveforms of the control signals used to control the system in FIG. 22. Reference characters /CE, /WR, and /RD indicate a chip enable signal, a write signal, and a read signal, respectively, well known signals in the field of the microcomputer system. /WR is set to the "0" level when the CPU writes the data into the FPGA of the present invention, whereas /RD is set to the "0" level when the CPU reads the data from the FPGA.

As an example of data read, the procedures for reading the stored data from any RAM cell in each unit circuit in the unit circuit matrix 106 will be explained. As shown in the FIG. 23, /CE is first brought at the "0" level. After the FPGA has been selected, /WR is placed at the "0" level, and the control data is written into the control register 105. A unique address has been previously allocated to the control register 105. With /WR = "0," when the address data is supplied onto the address bus ADB, then the control data is written into the control register 105. At this time, the data bus DB is supplied with such data as causes the output RA of the control register 105 to be at the "1" level and the output OB to be at the "0" level. This enables the row decoder 102 to select one from its outputs for RAM selection.

Next, when /RD is brought to the "0" level, the RAM cell corresponding to the address being supplied at that time is selected by the row decoder 102 and column decoder 104, causing the stored data to be supplied onto the data bus DB. In this way, the stored data in any RAM cell in the unit circuit is read out.

As might be easily imagined, to read the output Q of the unit circuit, the same reasoning holds for each control signal. That is, when the control data is first written into the control register 105, the data should be written in a manner that causes the output RA to be at the "0" level and OB to be at the "1" level.

As described above, in the system in FIG. 22, only the change of data on the data bus allows the same control signal to be used for reading both the stored data from any RAM cell in the unit circuit and the output Q of the unit circuit.

While in the system in FIG. 22, the row decoder is of the structure in FIG. 18, but may be of that in FIG. 19. It should be noticed in this case that the control register 105 is not required and the initial write operation is unnecessary in the FIG. 23 timing chart.

In this way, with the programmable logic unit circuit and programmable logic circuit in the above embodiment, it is possible to simplify the circuit configuration as compared with the conventional equivalent. It is also possible to easily observe the signal at any node in the unit circuit. This feature is useful in structuring a field programmable gate array.

As described above, with the present invention, it is possible to provide a programmable logic unit circuit and a programmable logic circuit suitable for constructing a field programmable gate array.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A programmable logic unit circuit of a gate array circuit comprising:
   a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data, the first input signal being supplied to the second input select circuit as one signal of the second plurality of signals;

a clock-synchronized circuit which latches the particular logic output signal from said combinational logic circuit upon receipt of a clock signal and outputs a latched output signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data.

2. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data, the first input signal being supplied to the second input select circuit as one signal of the second plurality of signals;

a clock-synchronized circuit which latches the particular logic output signal from said combinational logic circuit upon receipt of a clock signal and outputs a latched output signal, and which resets the latched output signal in response to a reset signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data.

3. A programmable logic unit circuit according to claims 1 or 2, wherein a logical state of said combinational logic circuit changes according to third data stored in said data memory circuit.

4. A programmable logic unit circuit according to claims 1 or 2, wherein the programmable logic unit circuit is arranged in a matrix form with a plurality of other programmable logic unit circuits.

5. A programmable logic unit circuit according to claims 1 or 2, wherein each of said input select circuits selects a signal, based on complementary levels of the first selecting data stored in said data memory circuit.

6. A programmable logic unit circuit according to claims 1 or 2, wherein each of said at least first and second input select circuits is supplied with a fixed value logic signal, the fixed value logic signal supplied to the first input select circuit being one signal of the first plurality of signals and the fixed value logic signal supplied to the second input select circuit being one signal of the second plurality of signals.

7. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data;

a clock-synchronized circuit which latches the particular logic output signal from said combinational logic circuit upon receipt of a clock signal and outputs a latched output signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data, wherein:

an output of the programmable logic unit circuit is input to at least one circuit of a plurality of other programmable logic unit circuits; and one of the first and second input signals to said combinational logic circuit is supplied to the clock-synchronized circuit as said clock signal.

8. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data;

a clock-synchronized circuit which latches the particular logic output signal from said combinational logic circuit upon receipt of a clock signal and outputs a latched output signal, and which resets the latched output signal in response to a reset signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data, wherein:

an output of the programmable logic unit circuit is input to at least one circuit of a plurality of other programmable logic unit circuits; and one of the first and second input signals to said combinational logic circuit is supplied to the clock-synchronized circuit as said reset signal.

9. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data;

a clock-synchronized circuit which latches the particular logic output signal from said combinational logic circuit upon receipt of a clock signal and outputs a latched output signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data, wherein:

an output of the programmable logic unit circuit is input to at least one circuit of a plurality of other programmable logic unit circuits; and one of the first and second input signals to said combinational logic circuit is supplied to the 3-state-output type output select circuit as a control signal for 3-state control.

10. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data;

a clock-synchronized circuit which latches the particular logic output signal from said combinational logic circuit upon receipt of a clock signal and outputs a latched output signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data, wherein:

an output of the programmable logic unit circuit is input to at least one circuit of a plurality of other programmable logic unit circuits;

one of the first and second input signals to said combinational logic circuit is supplied to the clock-synchronized circuit as said clock signal; and one of the first and second input signals to said combinational logic circuit is supplied to the 3-state-output type output select circuit as a control signal for 3-state control.

11. A programmable logic unit circuit of a gate array circuit comprising:

a combinational logic circuit which is supplied with at least a first input signal and a second input signal and which produces a particular logic output signal from those input signals;

at least a first select circuit and a second input select circuit, the first and second input select circuits respectively producing the first and second input signals based on first selecting data, the first selecting data including first part data and second part data, the first input signal being produced by selecting a signal from a first plurality of signals based on the first part data, the second input signal being produced by selecting a signal from a second plurality of signals based on the second part data;

a clock-synchronized circuit which latches the particular logic output signal from said combinational logic circuit upon receipt of a clock signal and outputs a latched output signal, and which resets the latched output signal in response to a reset signal;

a 3-state-output type output select circuit for selectively supplying one of the particular logic output signal of said combinational logic circuit and the latched output signal of said clock-synchronized circuit based on second selecting data; and a data memory circuit for storing at least said first and second selecting data, wherein:

an output of the programmable logic unit circuit is input to at least one circuit of a plurality of other programmable logic unit circuits;

one of the first and second input signals to said combinational logic circuit is supplied to the clock-synchronized circuit as said reset signal; and one of the first and second input signals to said combinational logic circuit is supplied to the 3-state-output type output select circuit as a control signal for 3-state control.

12. A programmable logic circuit comprising a plurality of programmable logic unit circuits, each programmable logic unit circuit including a first input select circuit producing a first input signal, a second input select circuit producing a second input signal, a combinational logic circuit connected to the first and second input select circuits for producing a logic output signal, a clock-synchronized circuit connected to the combinational logic circuit for producing a latched output signal, and a 3-state-output type output select circuit controlled by a control signal, wherein:

in a first programmable logic unit circuit, one of the first and second input signals to the corresponding combinational logic circuit is supplied to the corresponding clock-synchronized circuit as a first clock signal; and in a second programmable logic unit circuit, one of the first and second input signals to the corresponding combinational logic circuit is supplied to the corresponding 3-state-output type output select circuit as the control signal for output selection; and the first clock signal used in said first programmable logic unit circuit is supplied to the clock-synchronized circuit of the second programmable logic unit circuit as a second clock signal.

13. A programmable logic circuit comprising:

a plurality of programmable logic unit circuits, each programmable logic unit circuit including a first input select circuit producing a first input signal, a second input select circuit producing a second input signal, a combinational logic circuit connected to the first and second input select circuits for producing a logic output signal, a clock-synchronized circuit connected to the combinational logic circuit for producing a latched output signal which is reset by a reset signal, and a 3-state-output type output select circuit controlled by a control signal, wherein:

in a first programmable logic unit circuit, one of the first and second input signals to the corresponding combinational logic circuit is supplied to the corresponding clock-synchronized circuit as a first clock signal;

in a second programmable logic unit circuit, one of the first and second input signals to the corresponding combinational logic circuit is supplied to the 3-state-output type output select circuit as the control signal for output selection, and the first clock signal used in said first programmable logic unit circuit is supplied to the clock-synchronized circuit of the second programmable logic unit circuit as a second clock signal;

in the second programmable logic unit circuit, one of the first and second input signals to the corresponding combinational logic circuit is supplied to the corresponding clock-synchronized circuit as a second unit circuit reset signal; and in the first programmable logic circuit, the second unit circuit reset signal to the clock-synchronized circuit of the second programmable logic unit circuit is supplied to the clock-synchronized circuit of the first programmable logic unit circuit as a first unit circuit reset signal.

14. A programmable logic circuit according to claims 12 or 13, wherein the first and second clock signals supplied to the clock-synchronized circuits of said first and second programmable logic unit circuits, respectively, are complementary to each other.

15. A programmable logic circuit according to claim 14, wherein said first and second programmable logic unit circuits are formed in the same integrated circuit so as to adjoin each other.

16. A programmable logic unit circuit comprising:

a memory circuit for storing data;

a logic circuit whose circuit function is changed according to the stored data in said memory circuit, the logic circuit producing a signal to be observed;

read control means for controlling the reading of data from said memory circuit;

data lines for transferring the data read from said memory circuit; and observation control means which includes part of said read control means and which controls the reading of the signal to be observed, the signal to be observed being transferred via said data lines and including a pair of complementary signals having complementary logic levels.

17. A programmable logic unit circuit according to claim 16, wherein said read control means includes a memory circuit select line connected to said memory circuit.

18. A programmable logic unit circuit according to claim 17, wherein said observation control means includes:

signal lines for transferring the signal to be observed; and switch means which is inserted between a given node in said logic circuit and said signal lines, and which is controlled by a signal on said memory circuit select line.

19. A programmable logic unit circuit according to claim 16, wherein:

said observation control means is inserted between a given node in said logic circuit and said data lines;

said read control means includes a memory circuit select line for selectively controlling the reading of data from said memory circuit; and said observation control means is controlled by a separate signal different from a signal on said memory circuit select line.

* * * * *